US008860597B2

(12) United States Patent
Sienko

(10) Patent No.: US 8,860,597 B2
(45) Date of Patent: Oct. 14, 2014

(54) DIGITAL TO-ANALOG CONVERTER CIRCUITRY WITH WEIGHTED RESISTANCE ELEMENTS

(75) Inventor: Matthew D. Sienko, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/541,405

(22) Filed: Jul. 3, 2012

(65) Prior Publication Data

US 2013/0169461 A1 Jul. 4, 2013

Related U.S. Application Data

(60) Provisional application No. 61/505,018, filed on Jul. 6, 2011.

(51) Int. Cl.
*H03M 1/80* (2006.01)
*H03M 1/08* (2006.01)

(52) U.S. Cl.
CPC ............ *H03M 1/808* (2013.01); *H03M 1/0863* (2013.01)
USPC ........... 341/153; 341/144; 341/150; 341/152; 341/140; 370/295; 370/297; 375/265; 375/341

(58) Field of Classification Search
USPC .................................. 341/136–172; 370/270
See application file for complete search history.

(56) References Cited

U.S. PATENT DOCUMENTS 4,751,497 A * 6/1988 Torii ............................ 341/154
4,888,589 A * 12/1989 Bowers ......................... 341/153
4,973,979 A * 11/1990 Ikeda ............................ 341/154
5,764,174 A * 6/1998 Dempsey et al. ............. 341/154
6,411,273 B1 * 6/2002 Nakamura et al. .............. 345/98
6,608,577 B2 * 8/2003 Nishimura .................... 341/144
6,937,180 B1 * 8/2005 Muratov et al. ............... 341/154
7,030,799 B2 4/2006 Lee et al.
7,046,178 B2 * 5/2006 Draxelmayr .................. 341/120
7,336,211 B1 * 2/2008 Lai et al. ....................... 341/154
7,372,390 B2 * 5/2008 Yamada ........................ 341/155
7,373,272 B2 * 5/2008 Gualtieri ....................... 702/150
7,504,974 B2 * 3/2009 Iriguchi ........................ 341/139
7,714,759 B1 5/2010 Mu
8,471,737 B2 * 6/2013 Iso et al. ....................... 341/118
8,477,055 B2 * 7/2013 Choi et al. .................... 341/144
2011/0273317 A1 11/2011 Nagatani et al.
2011/0282924 A1 11/2011 Mallinson
2012/0007757 A1 1/2012 Choe et al.

OTHER PUBLICATIONS

Chan, et al., "Dynamic element matching to prevent nonlinear distortion from pulse-shape mismatches in high-resolution DACs," IEEE Journal of Solid-State Circuits, vol. 43, No. 9, 2008, pp. 2067-2078.

(Continued)

*Primary Examiner* — Lam T Mai
(74) *Attorney, Agent, or Firm* — William M. Hooks

(57) ABSTRACT

Digital-to-analog converter circuitry is described. The digital-to-analog converter circuitry includes a plurality of weighted resistance elements. A first weighted resistance element includes a switch coupled to a reference voltage. The first weighted resistance element also includes a T-network coupled to the switch. The T-network approximately equalizes a first response speed of the first weighted resistance element with a response speed of a differently weighted resistance element.

40 Claims, 14 Drawing Sheets

(56) References Cited

OTHER PUBLICATIONS

Fishov, et al., "Segmented mismatch-shaping D/A conversion," IEEE International Symposium on Circuits and Systems, 2002. ISCAS 2002, vol. 4, pp. IV-679-IV-682.
Galton, "Spectral Shaping of Circuit Errors in Digital-Analog Converters", IEEE Transactions on Circuit and Systems-II: Analog and Digital Signal Processing, vol. 44, No. 10, pp. 808-817, Oct. 1997.
Huang, et al., "A CT Sigma-Delta Modulator with a Hybrid Loop Filter and Capacitive Feedforward" 2011 IEEE 54th International Midwest Symposium on Circuits and Systems, 2011, pp. 1-4.
International Search Report and Written Opinion—PCT/US2012/045833—ISA/EPO—Dec. 6, 2012.
Lee, et al., "A 0.8 V, 2.6mW, 88 dB Dual-Channel Audio Delta-Sigma D/A Converter With Headphone Driver," IEEE Journal of Solid-State Circuits, vol. 44, No. 3, Mar. 2009, pp. 916-927.
Marche D., et al., "An Improved Switch Compensation Technique for Inverted R-2R Ladder DACs", IEEE Transactions on Circuits and Systems I: Regular Papers, IEEE, US, vol. 56, No. 6, Jun. 1, 2009, pp. 1115-1124, XP011333452, ISSN: 1549-8328, DOI: 10.11091/CSI.2008.2008510.
Nukala, et al., "A Compact Current Steering Dac with Component Swapping Calibration" 2010 IEEE Dallas Circuits and Systems Workshop, 2010, pp. 1-4.

* cited by examiner

DIGITAL TO-ANALOG CONVERTER CIRCUITRY WITH WEIGHTED RESISTANCE ELEMENTS

RELATED APPLICATIONS

This application is related to and claims priority from U.S. Provisional Patent Application Ser. No. 61/505,018 filed Jul. 6, 2011, for "USE OF T-NETWORK TO EQUALIZE THE SPEED OF WEIGHTED DAC ELEMENTS IN A RESISTOR DAC."

TECHNICAL FIELD

The present disclosure relates generally to integrated circuits. More specifically, the present disclosure relates to digital-to-analog converter circuitry with weighted resistance elements.

BACKGROUND

The use of electronic devices has greatly increased in recent years. For example, people often use cellular phones, smart phones, computers, music players, televisions and gaming systems, among other electronic devices. The use of electronic devices has become so prevalent that these devices are practically ubiquitous in modern society. The decreasing cost of electronic components has particularly encouraged the widespread use of electronic devices.

Electronic devices are often designed and implemented in a modular fashion. For example, an electronic device may include multiple electronic modules or blocks implemented using electronic components and/or integrated circuitry. These modules or blocks typically provide certain functionality used in the operation of the electronic device.

Integrated circuits may provide differing functions for an electronic device. In particular, some integrated circuits are used for processing digital and/or analog signals. For example, one integrated circuit or a component of an integrated circuit may convert digital signals to analog signals. As can be seen from this discussion, systems and methods that improve performance and/or reduce size of electronic components may be beneficial.

SUMMARY

Digital-to-analog converter circuitry is described. The digital-to-analog converter circuitry includes a plurality of weighted resistance elements. A first weighted resistance element includes a switch coupled to a reference voltage. The first weighted resistance element also includes a T-network coupled to the switch. The T-network approximately equalizes a first response speed of the first weighted resistance element with a response speed of a differently weighted resistance element.

The T-network may include a first resistance coupled to the switch, a second resistance coupled to the first resistance and a shunt resistance coupled to the first resistance and to the second resistance. The T-network may also include a third resistance coupled to the shunt resistance and a fourth resistance coupled to the third resistance and to the shunt resistance.

The switch may be a first high switch and the reference voltage may be a high reference voltage. The first weighted resistance element may also include a first low switch coupled to a low reference voltage and to the first resistance, a second high switch coupled to the high reference voltage and to the third resistance. The first weighted resistance element may also include a second low switch coupled to the low reference voltage and to the third resistance.

The plurality of weighted resistance elements may include a 32× weighted resistance element, a 16× weighted resistance element, an 8× weighted resistance element, a 4× weighted resistance element, a 2× weighted resistance element and a 1× weighted resistance element. $R_x$ may be a unit resistance. The 32× weighted resistance element may include a 32× first resistance including two $24R_x$ resistors in parallel and the 16× weighted resistance element may include a 16× first resistance including one $24R_x$ resistor.

$R_x$ may be a unit resistance. The 8× weighted resistance element may include an 8× first resistance including one $12R_x$ resistor, an 8× shunt resistance including two $12R_x$ resistors in parallel and an 8× second resistance including one $12R_x$ resistor.

$R_x$ may be a unit resistance. The 4× weighted resistance element may include a 4× first resistance including one $16R_x$ resistor, a 4× shunt resistance including two $8R_x$ resistors in parallel and a 4× second resistance including one $16R_x$ resistor.

$R_x$ may be a unit resistance. The 2× weighted resistance element may include a 2× first resistance including one $16R_x$ resistor, a 2× shunt resistance including two $8R_x$ resistors in parallel and a 2× second resistance including one $32R_x$ resistor.

$R_x$ may be a unit resistance. The 1× weighted resistance element may include a 1× first resistance including one $32R_x$ resistor, a 1× shunt resistance including two $8R_x$ resistors in parallel and a 1× second resistance including one $32R_x$ resistor.

Each of the plurality of weighted resistance elements may be coupled to a mismatch shaper. The mismatch shaper may be coupled to a delta-sigma modulator. The weighted resistance elements may not be arranged in an R-2R ladder.

The digital-to-analog converter circuitry may be implemented in an audio codec. The digital-to-analog converter circuitry may be implemented in a wireless communication device.

A method for converting a digital signal to an analog signal on digital-to-analog converter circuitry is also described. The method includes providing a reference voltage to a plurality of weighted resistance elements. A first weighted resistance element includes a switch coupled to the reference voltage and to a T-network. The method also includes applying the reference voltage to the T-network. The T-network approximately equalizes a first response speed of the first weighted resistance element with a response speed of a differently weighted resistance element. The method also includes providing an output current.

A computer-program product for converting a digital signal to an analog signal is also described. The computer-program product includes a non-transitory tangible computer-readable medium with instructions. The instructions include code for causing a digital-to-analog converter to provide a reference voltage to a plurality of weighted resistance elements. A first weighted resistance element includes a switch coupled to the reference voltage and to a T-network. The instructions also include code for causing the digital-to-analog converter to apply the reference voltage to the T-network. The T-network approximately equalizes a first response speed of the first weighted resistance element with a response speed of a differently weighted resistance element. The instructions further include code for causing the digital-to-analog converter to provide an output current.

An apparatus for converting a digital signal to an analog signal is also described. The apparatus includes means for providing a reference voltage to a plurality of weighted resistance elements. A first weighted resistance element includes means for switching coupled to the reference voltage and to a T-network. The apparatus also includes means for applying the reference voltage to the T-network. The T-network includes means for approximately equalizing a first response speed of the first weighted resistance element with a response speed of a differently weighted resistance element. The apparatus further includes means for providing an output current.

DETAILED DESCRIPTION

Figure 1:
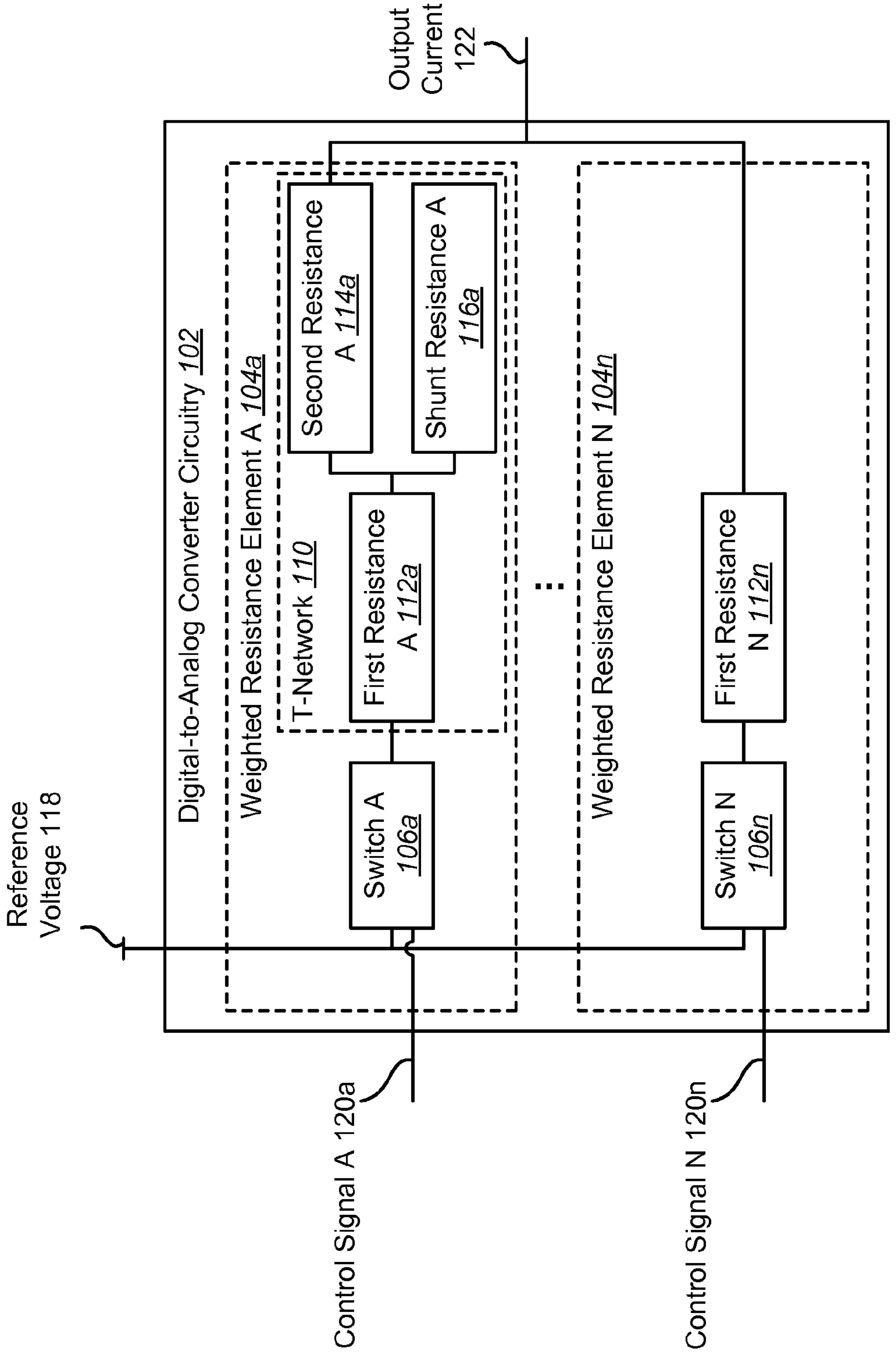
FIG. 1 is a block diagram illustrating one configuration of digital-to-analog converter circuitry in accordance with the systems and methods disclosed herein.

It should be noted that the terms "couple," "coupling," "coupled" or other variations of the word couple as used herein may indicate either an indirect connection or a direct connection. For example, if a first component is "coupled" to a second component, the first component may be either indirectly connected (e.g., through one or more other components) to the second component or directly connected to the second component.

Additionally, it should be noted that as used herein, designating a component, element or entity (e.g., transistor, capacitor, resistor, power supply, circuit, filter, switch, block, module, etc.) as a "first," "second," "third" or "fourth" component, etc., may be used to distinguish components for explanatory clarity. It should also be noted that labels used to designate a "first," "second," "third" or "fourth," component etc., do not necessarily imply a particular order or that elements with lower value labels are included or used.

As used herein, the terms "circuit," "circuitry" and other variations of the term "circuit" may denote at least one structural element or component. For example, circuitry may include one or more elements or components such as resistors, capacitors, inductors, transistors, amplifiers, transformers, flip-flops, registers, etc. Additionally or alternatively, circuitry may be an aggregate of circuit components, such as integrated circuit components, in the form of processing and/or memory cells, units, blocks and/or other components.

The systems and methods disclosed herein describe approximately equalizing the speeds of weighted resistance elements in digital-to-analog converter (DAC) circuitry. For example, one or more T-networks may be implemented to approximately equalize the speed of weighted resistance elements in a resistor digital-to-analog converter. In particular, the systems and methods disclosed herein relate to approximately equalizing the speed of differently weighted elements in a weighted resistor digital-to-analog converter. In some configurations, the systems and methods disclosed herein may be implemented in one or more digital-to-analog converters in an audio codec (e.g., coder/decoder).

A resistive digital-to-analog converter may employ a resistor array with weighted bit values. For example, the weighting is based on the amount of current that a given input bit injects into an amplifier (e.g., power amplifier or "PA") virtual ground node. For instance, one or more 1× weighted resistance elements may each contribute the least significant bit (LSB) current for the digital-to-analog converter. One or more 2× weighted resistance elements may contribute approximately twice the current of the 1× elements. One or more 4× weighted resistance elements may contribute approximately twice the current of the 2× elements and so on up to a particular weighting (e.g., 32× weighting).

The speed of weighted resistance elements may differ depending on the weight of the element. For example, a 1× element may be slower than a 2× element, which may be slower than a 4× element and so on. The speed of a weighted resistance element (of a digital-to-analog converter, for example) is limited by the resistor-capacitor (RC) time constant formed by the element's own resistance and the parasitic capacitance to the substrate. Thus, differently weighted digital-to-analog converter elements may have transient effects with different speeds. A difference in speed for the differently weighted units introduces glitches in the digital-to-analog converter output that increase both the in-band and out-of-band digital-to-analog converter noise. For example, transitions where one high weighted element is to be approximately cancelled out by many low weighted elements may instead generate transient glitches due to the speed difference between them. This causes excess in band and out of band noise. In particular, differences in propagation delay among different weighted elements may cause excess quantization noise. In this case, out-of-band noise increases. Furthermore, out-of-band noise mixes with itself and folds in-band in this case.

One or more T-networks may be applied to the weighted resistance elements (e.g., low-weighted resistance elements) to tune their speeds in order to approximately equalize speeds between weighted resistance elements. For example, T-networks may be applied to resistance elements in four least significant bit (LSB) weights (e.g., 1×, 2×, 4×, 8×) to tune the speed of each element so that they approximately match the 16× and 32× elements. This may reduce (e.g., minimize) the glitches at the digital-to-analog converter output. Thus, to reduce the weight of the low weight resistance elements, resistor T-networks may be implemented instead of series (resistance) units.

In a weighted digital-to-analog converter, a positive transition in a high weighted element may be approximately cancelled by multiple negative transitions in low weighted elements. However, if the transition speeds are different for the differently weighted elements, then a transient error pulse (e.g., glitch) is generated at the output. These problems may particularly occur in the context of weighted resistor digital-to-analog converters that use mismatch shaping or oversampling.

Static weighted resistor digital-to-analog converters are often implemented using R-2R ladders, which have different speeds for the differently weighted bits. Thus, an R-2R ladder architecture does not solve the problem of different speeds. Other oversampled resistor digital-to-analog converters that use mismatch shaping employ un-weighted elements (e.g., un-weighted digital-to-analog converters with approximately equally-sized resistors). These elements are uniform and have speeds roughly equal to one another. However, digital-to-analog converters that do not use weighting require a large implementation area for digital-to-analog converters greater than five bits.

In accordance with the systems and methods disclosed herein resistor element weighting may be accomplished using T-networks. For example, the speed of the weighted resistance elements can be adjusted by changing the shunt resistance while maintaining the same effective element weight. Accordingly, an area-efficient weighted resistor digital-to-analog converter can be built with similar speeds for all the units such that transient glitches are reduced (e.g., minimized). In contrast to known designs, the architecture provided by the systems and methods disclosed herein enables simultaneous reduction of power, area, noise and distortion. Thus, the systems and methods disclosed herein may allow designs that are not possible using known approaches (where speed variations for different bit weights would not meet performance requirements, for example). The architecture provided by the systems and methods disclosed herein may also improve (e.g., maximize) the benefit of companding in an audio codec. The combination of the resistive digital-to-analog converter (as described herein) and companding may allow the production of high noise performance in audio codecs while reducing implementation area and power consumption.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of digital-to-analog converter circuitry 102 in accordance with the systems and methods disclosed herein. The digital-to-analog converter circuitry 102 includes multiple weighted resistance elements 104*a-n*. At least one of the weighted resistance elements 104 may be differently weighted from another of the weighted resistance elements 104. Each weighted resistance element 104*a-n* may include at least a switch 106*a-n* and a first resistance 112*a-n*. For example, weighted resistance element A 104*a* includes switch A 106*a* and first resistance A 112*a*, while weighted resistance element N 104*n* includes switch N 106*n* and first resistance N 112*n*.

Each of the switches 106*a-n* is coupled to a reference voltage 118. Each of the switches 106*a-n* may be separately activated to apply the reference voltage 118 to respective weighted resistance element(s) 104*a-n*. For example, each switch 106*a-n* is coupled to a control signal 120*a-n* that activates (or deactivates) the respective switch 106*a-n*. For example, when switch N 106*n* is activated by control signal N 120*n*, the reference voltage 118 is applied to weighted resistance element N 104*n* (e.g., first resistance N 112*n*). In some configurations, the control signals 120*a-n* may be a weighted thermometer code corresponding to a digital signal to be converted by the digital-to-analog converter circuitry 102.

Each weighted resistance element 104*a-n* produces a given output current 122 contribution when the reference voltage 118 is applied to the respective weighted resistance element 104*a-n*. The amount of each output current 122 contribution depends on the reference voltage 118 and the effective resistance of each weighted resistance element 104. Each output current 122 contribution (from activated weighted resistance element(s) 104 or from each weighted resistance element 104 with an activated switch 106, for example) contributes to the output current 122 of the digital-to-analog converter circuitry 102. Thus, multiple output current 122 contributions may be combined to provide the output current 122.

In known approaches as described above, different weighted elements may have different response speeds (e.g., propagation delays), which may cause glitches. It should be noted, however, that the digital-to-analog converter circuitry 102 described herein is different in structure from known approaches. For example, at least one of the weighted resistance elements 104*a-n* may not be implemented as a series resistor string or in accordance with an R-2R ladder structure. In accordance with the systems and methods disclosed herein, at least one weighted resistance element 104 may include a T-network in order to approximately equalize response speeds between differently weighted resistance elements 104. Approximately equalizing response speeds between (differently) weighted resistance elements 104 may reduce glitches.

One or more of (e.g., one, some or all of) the weighted resistance elements 104*a-n* may include a T-network. In the configuration illustrated in FIG. 1, for example, weighted resistance element A 104*a* includes a T-network 110. The T-network 110 is coupled to switch A 106*a*. When switch A 106*a* is activated by control signal A 120*a*, the reference voltage 118 is applied to the T-network 110. In accordance with the systems and methods disclosed herein a T-network may include at least one shunt resistance. The T-network 110 may also include an output port. A shunt resistance is a resistance that is either coupled to ground or to an inverse differential path. A shunt resistance (e.g., shunt resistance A 116*a*) may be tuned to approximately equalize the response speeds (propagation delays) of differently weighted resistance elements. For example, a shunt resistance may increase the effective resistance of a weighted resistance element. An output port provides an output current contribution for a weighted resistance element. For example, an output port may be coupled (e.g., connected) to an amplifier (e.g., to the virtual ground of an operational amplifier) and to one or more output ports corresponding to other weighted resistance elements.

The T-network 110 includes first resistance A 112*a*, second resistance A 114*a* and shunt resistance A 116*a*. As used herein, a "resistance" may include one or more resistors. When a resistance includes multiple resistors, the resistors may be arranged in series with and/or in parallel to one another.

In some examples, a first side of first resistance A 112*a* is coupled to switch A 106*a*. Furthermore, a first side of second resistance A 112*a* is coupled to a second side of first resistance A 112*a*. Additionally, a first side of shunt resistance A 116*a* is coupled to the second side of first resistance A 112*a* and to the first side of second resistance A 114*a*. A second side of second resistance A 114*a* (e.g., an output port) provides an output current 122 contribution when switch A 106*a* is activated. In one configuration, the first side of second resistance A 114*a* is connected to the first side of shunt resistance A 116*a* and the second side of second resistance A 114*a* is an output port connected to an amplifier (e.g., an operational amplifier virtual ground). The T-network 110 enables weighted resistance element A 104*a* to provide a given output current 122 contribution while providing a response speed that is approximately equalized with one or more other weighted resistance elements 104. This reduces glitches in the output current 122.

Known approaches employ series resistors or R-2R resistor ladders in order to produce a given output current contributions. However, the differently weighted elements in these known approaches exhibit different response speeds (e.g., propagation delays), which cause glitches as described above. This comes as a result of parasitic capacitances corresponding to resistors. For example, as the length of a series resistor chain or an R-2R ladder increases, the corresponding response speed decreases. However, a T-network 110 in accordance with the systems and methods disclosed herein provides the effective resistance required to produce a given output current 122 contribution while allowing approximate equalization of response speeds between different weighted resistance elements 104.

Figure 2:
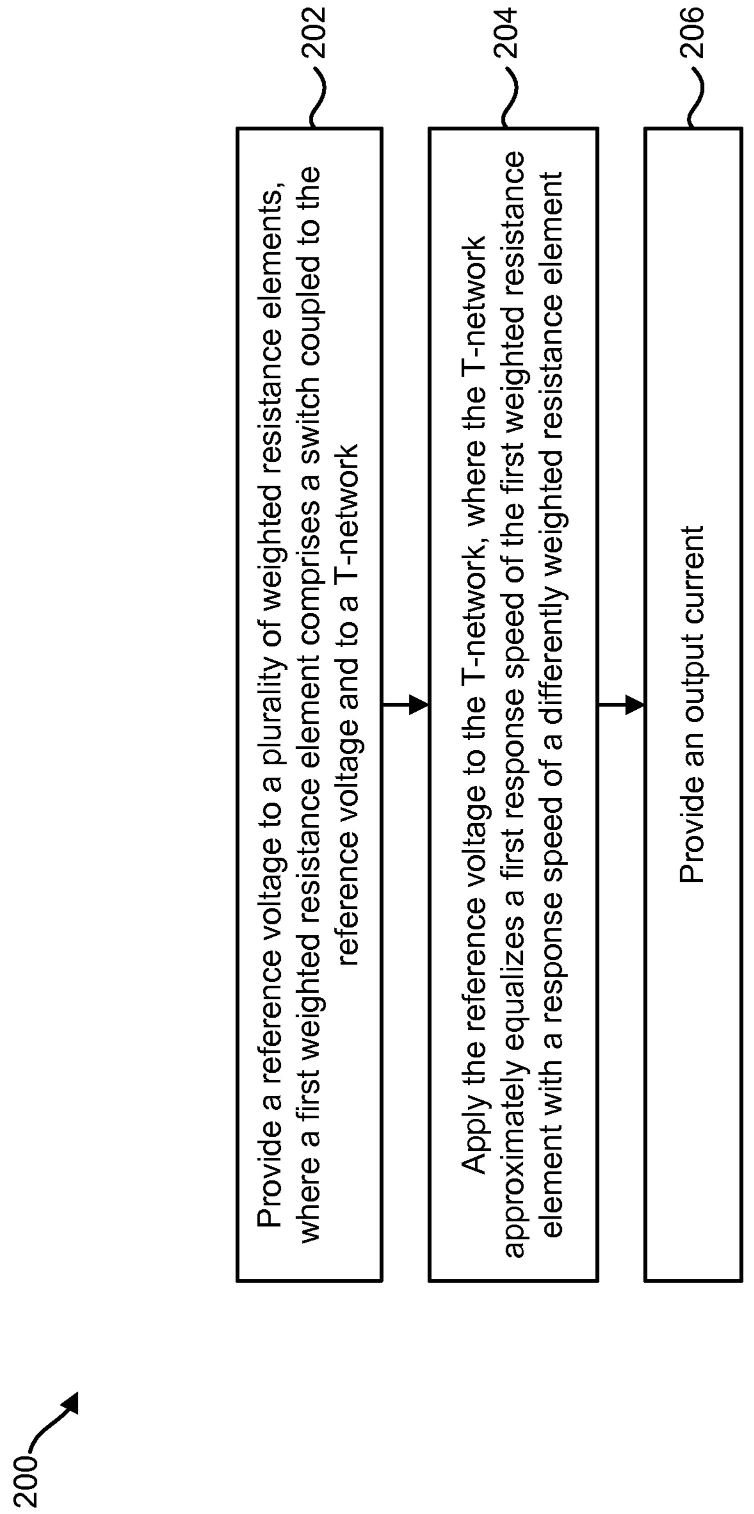
FIG. 2 is a flow diagram illustrating one configuration of a method for converting a digital signal to an analog signal on digital-to-analog converter circuitry.

FIG. 2 is a flow diagram illustrating one configuration of a method 200 for converting a digital signal to an analog signal on digital-to-analog converter circuitry 102. The digital-to-analog converter circuitry 102 may provide 202 a reference voltage 118 to a plurality of weighted resistance elements 104. At least one of the weighted resistance elements 104 includes a switch 106 coupled to the reference voltage 118 and to a T-network 110.

The digital-to-analog converter circuitry 102 may apply 204 (e.g., switch) the reference voltage to the T-network 110. The T-network 110 approximately equalizes a response speed of its corresponding weighted resistance element 104 with a response speed of a differently weighted resistance element 104.

The digital-to-analog converter circuitry 102 may provide 206 an output current 122. For example, each activated weighted resistance element 104 provides an output current 122 contribution. If only one weighted resistance element 104 is activated, its corresponding output current 122 contribution may be provided 206 as the output current 122. However, if multiple weighted resistance elements 104 are activated, their corresponding output current 122 contributions may be combined to provide 206 the output current.

Figure 3:
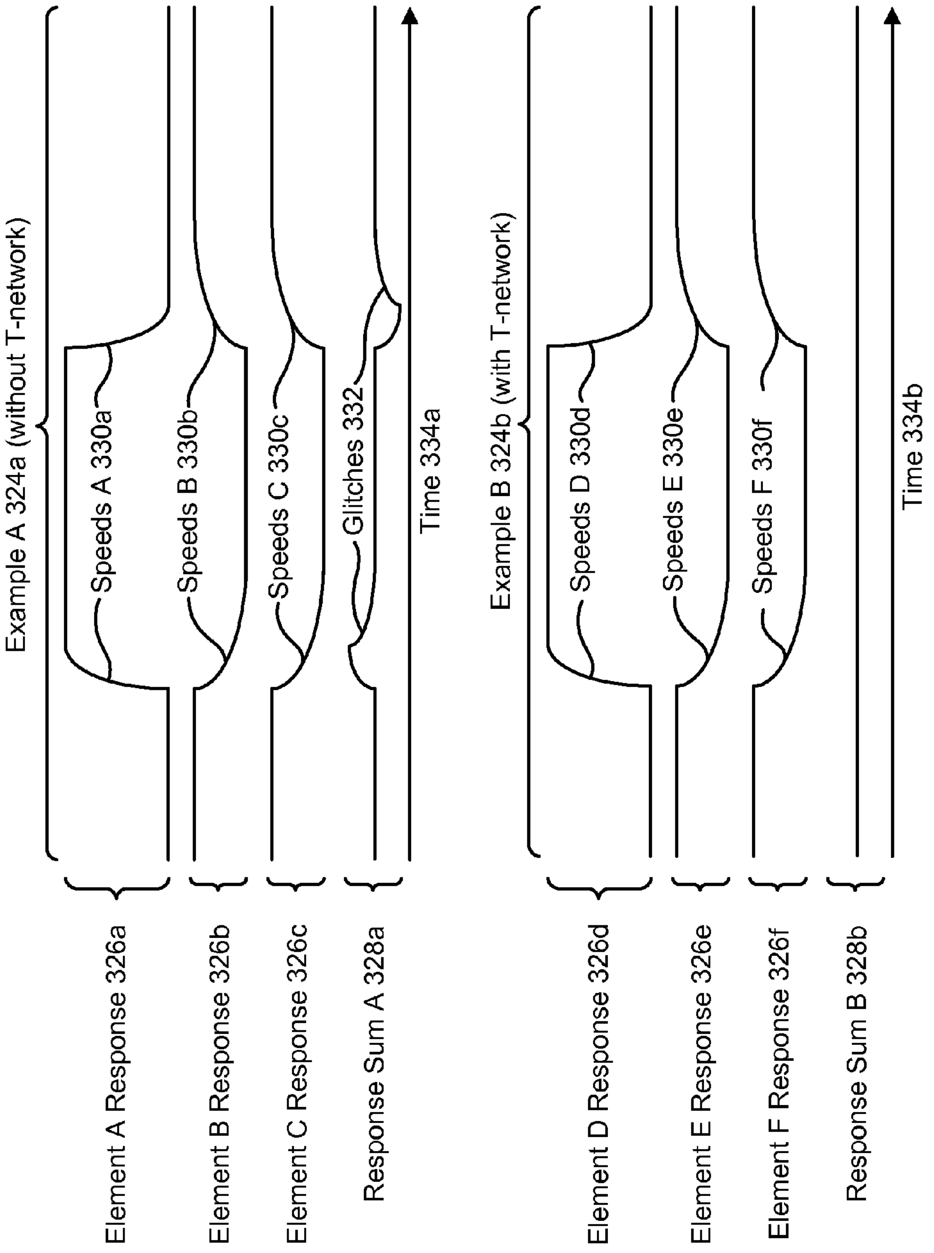
FIG. 3 is a diagram illustrating examples of weighted element responses.

FIG. 3 is a diagram illustrating examples 324*a-b* of weighted element responses. In particular, example A 324*a* illustrates the response of a weighted digital-to-analog converter with weighted elements with unequal response speeds 330*a-c*. Example B 324*b* illustrates the response of a weighted digital-to-analog converter with weighted elements with approximately equal response speeds 330*d-f*.

More specifically, example A 324*a* illustrates weighted element responses 326*a-c* and response sum A 328*a* for a weighted digital-to-analog converter without a T-network as described herein. For example, weighted element A may be a higher weighted element than weighted elements B and C. The element A response 326*a* illustrates response speeds A 330*a* for weighted element A over time 334*a*. Furthermore, the element B response 326*b* and the element C response 326*c* illustrate respective response speeds B 330*b* and response speeds C 330*c* over time 334*a* for (lower) weighted element B and (lower) weighted element C. Response sum A 328*a* illustrates the sum or combination of the responses 326*a-c* for weighted elements A-C. As illustrated in example A 324*a*, response sum A 328*a* includes glitches 332 due to differences in response speed A 330*a* of weighted element A and response speeds B-C 330*b-c* of respective weighted elements B-C. In other words, mismatches in pulse transitions may cause digital-to-analog converter output errors. In a weighted digital-to-analog converter, for example, if response speeds are different for differently weighted elements, then a transient error pulse (e.g., glitch) is generated at the output (e.g., response sum A 328*a*).

Example B 324*b* illustrates weighted element responses 326*d-f* and response sum B 328*b* for a weighted digital-to-analog converter with a T-network as described herein. For example, weighted element D may be a higher weighted element than weighted elements E and F. The element D response 326*d* illustrates response speeds D 330*d* for weighted element D over time 334*b*. Furthermore, the element E response 326*e* and the element F response 326*f* illustrate respective response speeds E 330*e* and response speeds F 330*f* over time 334*b* for (lower) weighted element E and (lower) weighted element F. Response sum B 328*b* illustrates the sum or combination of the responses 326*d-f* for weighted elements D-F. As illustrated in example B 324*b*, response sum B 328*b* does not exhibit glitches, since the response speeds D 330*d* of weighted element D and response speeds E-F 330*e-f* of respective weighted elements E-F are approximately equalized. Accordingly, the positive element D response 326*d* and the negative element E-F responses 326*e-f* approximately cancel. For instance, a positive pulse in an 8× weighted resistance element may be approximately cancelled by two negative 4× pulses.

Figure 4:
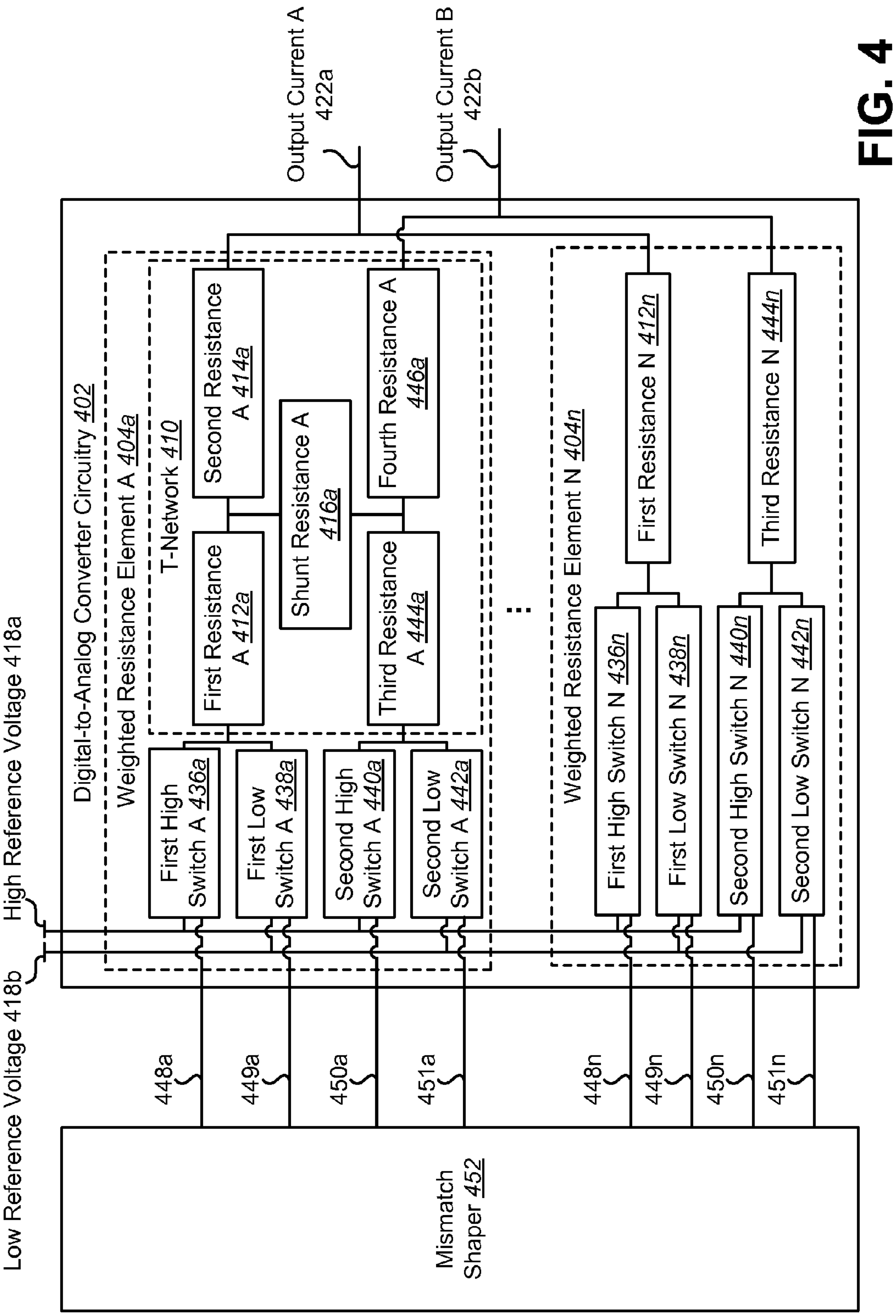
FIG. 4 is a block diagram illustrating a more specific configuration of digital-to-analog converter circuitry in accordance with the systems and methods disclosed herein.

FIG. 4 is a block diagram illustrating a more specific configuration of digital-to-analog converter circuitry 402 in accordance with the systems and methods disclosed herein. In this configuration, the digital-to-analog converter circuitry 402 may convert differential voltages (e.g., control signals 448*a-n*, 449*a-n*, 450*a-n*, 451*a-n*) at the input to a differential current (e.g., output current A 422*a* and output current B 422*b*) at its output. This differential current 422 may be applied to virtual ground nodes of an op-amp (e.g., power amplifier (PA)) input. This may produce an output voltage that can either be single ended or differential, depending on the configuration.

A differential signal (e.g., voltage, current) may include two individual signals. For example, a differential signal may include "positive" and "negative" voltages $V_p$ and $V_n$, where the differential voltage is the difference $V_p - V_n$. In other words, signals in a differential signal pair may be approximately inverse (in voltage polarity and/or in current direction, for example) to each other. In some configurations, the control signals 448*a-n*, 449*a-n*, 450*a-n*, 451*a-n* may be implemented as differential signals. More detail is given below.

The digital-to-analog converter circuitry 402 includes multiple weighted resistance elements 404*a-n*. Each weighted resistance element 404*a-n* may include respective switches 436*a-n*, 438*a-n*, 440*a-n*, 442*a-n*, a first resistance 412*a-n* and a third resistance 444*a-n*. For example, weighted resistance element A 404*a* includes first high switch A 436*a*, first low switch A 438*a*, second high switch A 440*a*, second low switch A 442*a*, first resistance A 412*a* and third resistance A 444*a*. Additionally, weighted resistance element N 404*n* includes first high switch N 436*n*, first low switch N 438*n*, second high switch N 440*n*, second low switch N 442*n*, first resistance N 412*n* and third resistance N 444*n*. The first resistance N 412*n* may provide an output port to output current A 422*a* and the third resistance N 444*n* may provide an output port to output current B 422*b*. In the case of switches, the terms "high" and "low" may be used to denote a correspondence to either the high reference voltage 418*a* or to the low reference voltage 418*b*.

Each of the high switches 436*a-n*, 440*a-n* is coupled to a high reference voltage 418*a*. Each of the low switches 438*a-n*, 442*a-n* is coupled to a low reference voltage 418*b*. The high reference voltage 418*a* may be a higher voltage than the low reference voltage 418*b*. The high reference voltage 418*a* and the low reference voltage 418*b* may or may not be similar in magnitude and/or inverse in polarity from each other. It should be noted that the reference voltage differential (e.g., the high reference voltage 418*a* minus the low reference voltage 418*b*) may set the digital-to-analog converter circuitry 402 swing (e.g., the common mode voltage or the high reference voltage 418*a* plus the low reference voltage 418*b* divided by two does not). For example, the following three pairs for the high reference voltage 418*a* and the low reference voltage 418*b* may all produce the same swing at an op-amp (e.g., PA) output, but may have different bias conditions: (3,1), (2,0), (+1,−1).

Each of the high switches 436*a-n*, 440*a-n* may be separately activated to apply the high reference voltage 418*a* to respective weighted resistance element(s) 404*a-n*. Additionally, each of the low switches 438*a-n*, 442*a-n* may be separately activated to apply the low reference voltage 418*b* to respective weighted resistance element(s) 404*a-n*. For example, each first high switch 436*a-n* is coupled to respective control signals 448*a-n* and each second high switch 440*a-n* is coupled to respective control signals 450*a-n* that activate (or deactivate) the respective high switch 436*a-n*, 440*a-n*. For instance, when first high switch N 436*n* is activated by a control signal 448*n*, the high reference voltage 418*a* is applied to weighted resistance element N 404*n* (e.g., first resistance N 412*n*). Additionally, each first low switch 438*a-n* is coupled to respective control signals 449*a-n* and each second low switch 442*a-n* is coupled to respective control signals 451*a-n* that activate (or deactivate) the respective low switch 438*a-n*, 442*a-n*.

As mentioned above, the control signals 448*a-n*, 449*a-n*, 450*a-n*, 451*a-n* may be implemented as differential signals in some configurations. For example, a control signal 448*a* (coupled to first high switch A 436*a*) and a control signal 450*a* (coupled to second high switch A 440*a*) may be a differential pair (e.g., approximately inverse to each other). Furthermore, a control signal 449*a* (coupled to first low switch A 438*a*) and a control signal 451*a* (coupled to second low switch A 442*a*) may be differential pair. Similarly, a control signal 448*n* (coupled to first high switch N 436*n*) and a control signal 450*n* (coupled to second high switch N 440*n*) may be a differential pair and a control signal 449*n* (coupled to first low switch N 438*n*) and a control signal 451*n* (coupled to second low switch N 442*n*) may be differential pair. Accordingly, the first switches 436*a-n*, 438*a-n* and second switches 440*a-n*, 442*a-n* may be driven by opposite polarity signals. In particular, the first switches 436*a-n*, 438*a-n* may be driven by positive control signals (e.g., $V_p$) and the second switches 440*a-n*, 442*a-n* may be driven by the negative control signals (e.g., $V_n$), which is accomplished by swapping the controls. When a weighted resistance element 404 is driving a positive signal, for instance, its first high switch 436 is on (e.g., coupled to the high reference voltage 418*a*), its first low switch 438*a* is off, its second high switch 440 is off, and its second low switch 442 is on (e.g., coupled to the low reference voltage 418*b*). When a weighted resistance element 404 is driving a negative signal, for instance, its first high switch 436 is off, its first low switch 438 is on (e.g., coupled to the low reference voltage 418*b*), its second high switch 440 is on (e.g., coupled to the high reference voltage 418*a*), and its second low switch 442 is off.

In the configuration illustrated in FIG. 4, each of the control signals 448*a-n*, 449*a-n*, 450*a-n*, 451*a-n* are provided by a mismatch shaper 452. For example, the mismatch shaper 452 may be coupled to digital-to-analog converter circuitry 402 (e.g., to each weighted resistance element 404*a-n*). The mismatch shaper 452 may be implemented in hardware, software or a combination of both. In some configurations, the control signals 448*a-n*, 449*a-n*, 450*a-n*, 451*a-n* may be a weighted thermometer code corresponding to a digital signal to be converted by the digital-to-analog converter circuitry 402.

Each weighted resistance element 404*a-n* produces a given output current A 422*a* contribution and a given output current B 422*b* contribution when the high reference voltage 418*a* or low reference voltage 418*b* is applied to the respective weighted resistance element 404*a-n*. The amount of each output current 422*a-b* contribution depends on the reference voltages 418*a-b* and the effective resistance of each weighted resistance element 404*a-n*. Each output current 422*a-b* contribution (from activated weighted resistance element(s) 404*a-b* or from each weighted resistance element 404*a-b* with an activated switch 436, 438, 440, 442, for example) contributes to the output current 422*a-b* of the digital-to-analog converter circuitry 402. Thus, multiple output current 422 contributions may be combined to provide the output currents 422*a-b*.

In known approaches as described above, different weighted elements may have different response speeds, which may cause glitches. In accordance with the systems and methods disclosed herein, however, at least one weighted resistance element 404 may include a T-network in order to approximately equalize response speeds between weighted resistance elements 404. Approximately equalizing response speeds between weighted resistance elements 404 may reduce glitches.

One or more of (e.g., one, some or all of) the weighted resistance elements 404*a-n* may include a T-network. In the configuration illustrated in FIG. 4, for example, weighted resistance element A 404*a* includes a T-network 410. The T-network 410 is coupled to first high switch A 436*a*, first low switch A 438*a*, second high switch A 440*a* and second low switch A 442*a*. When one or more of first high switch A 436*a*, first low switch A 438*a*, second high switch A 440*a* and second low switch A 442*a* are activated by respective control signals 448*a*, 449*a* 450*a*, 451*a*, the high reference voltage 418*a* and/or low reference voltage 418*b* is applied to the T-network 410.

The T-network 410 includes first resistance A 412*a*, second resistance A 414*a*, shunt resistance A 416*a*, third resistance A 444*a* and fourth resistance A 446*a*. Second resistance A 414*a* may provide an output port for a current contribution to output current A 422*a*, while fourth resistance A 446*a* may provide an output port for a current contribution to output current B 422*b*. The T-network 410 enables weighted resistance element A 404*a* to provide a given output current 422*a-b* contribution while providing a response speed that is approximately equalized with one or more other (differently) weighted resistance elements 404. This reduces glitches in the output currents 422*a-b*. In some configurations, first resistance A 412*a* and second resistance A 414*a* may be one signal path, while third resistance A 444*a* and fourth resistance A 446*a* may be a second signal path that is approximately inverse from (e.g., differential with respect to) the first signal path. For example, first resistance A 412*a* and second resistance A 414*a* provide signal resistors for the positive half of the differential signal and third resistance A 444*a* and fourth resistance A 446*a* provide signal resistors for the negative half or the differential signal. One example of the digital-to-analog converter circuitry 402 and the mismatch shaping 452 illustrated in FIG. 4 may be a 9-bit segmented digital-to-analog converter with mismatch shaping.

Known approaches employ series resistors or R-2R resistor ladders in order to produce a given output current contributions. However, the weighted elements in these known approaches exhibit different response speeds, which cause glitches as described above. This comes as a result of parasitic capacitances corresponding to resistors. For example, as the length of a series resistor chain or an R-2R ladder increases, the corresponding response speed decreases. However, a T-network 410 in accordance with the systems and methods disclosed herein provides the effective resistance required to produce a given output current 422*a-b* contribution while allowing approximate equalization of response speeds between different weighted resistance elements 404.

Figure 5:
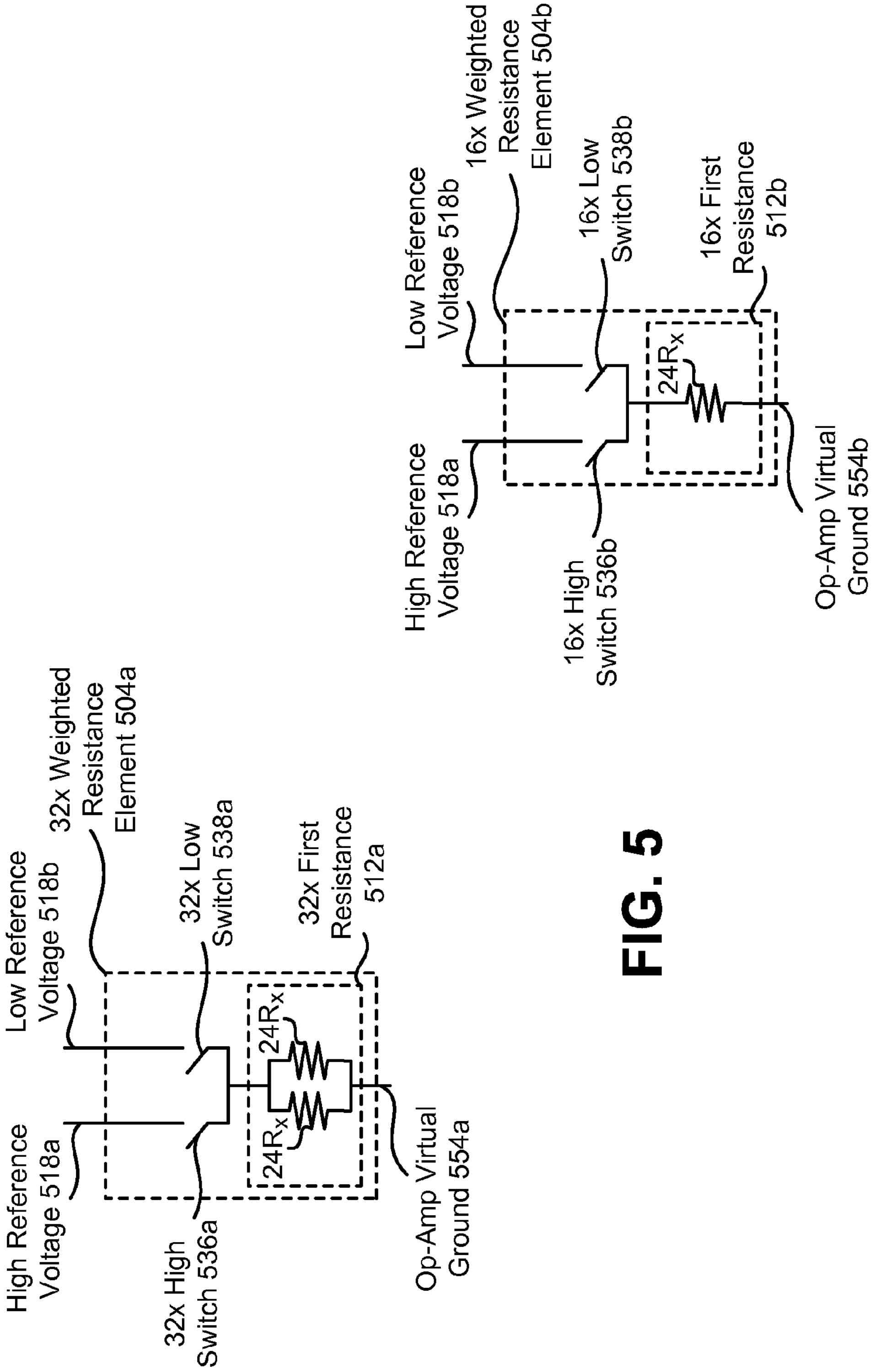
FIG. 5 is a diagram illustrating one example of a 32× weighted resistance element and one example of a 16× weighted resistance element.

FIG. 5 is a diagram illustrating one example of a 32× weighted resistance element 504*a* and one example of a 16× weighted resistance element 504*b*. In accordance with the systems and methods disclosed herein, digital-to-analog converter circuitry includes multiple weighted resistance elements. For convenience, a weighted resistance element (and components thereof (e.g., resistances)) may be denoted according to a current weight (e.g., 1×, 2×, 4×, 8×, 16× and/or 32×) provided or contributed by the corresponding weighted resistance element (when activated). The weight of a weighted resistance element may indicate an amount of output current contribution provided by the weighted resistance element when activated. For example, an 8× weighted resistance element may provide approximately eight times the current contribution of a 1× weighted resistance element. In examples of weighted resistance elements given herein, resistor values may be expressed in terms of multiples of a unit resistance, $R_x$.

The 32× weighted resistance element 504*a* illustrated in FIG. 5 includes a 32× high switch 536*a* coupled to a high reference voltage 518*a* and a 32× low switch 538*a* coupled to a low reference voltage 518*b*. The 32× weighted resistance element 504*a* also includes a 32× first resistance 512*a* coupled to the 32× high switch 536*a* and to the 32× low switch 538*a*. In this example, the 32× first resistance 512*a* includes two ($24R_x$) resistors coupled in parallel. The 32× first resistance 512*a* may be coupled to an op-amp virtual ground 554*a*. The 32× high switch 536*a* may be activated to apply the high reference voltage 518*a* to the 32× first resistance 512*a*. Alternatively, the 32× low switch 538*a* may be activated to apply the low reference voltage 518*b* to the 32× first resistance 512*a*. When activated, the 32× weighted resistance element 504*a* may contribute a current to the op-amp virtual ground 554*a* that is approximately 32 times that of a 1× weighted resistance element.

The 16× weighted resistance element 504*b* illustrated in FIG. 5 includes a 16× high switch 536*b* coupled to a high reference voltage 518*a* and a 16× low switch 538*b* coupled to a low reference voltage 518*b*. The 16× weighted resistance element 504*b* also includes a 16× first resistance 512*b* coupled to the 16× high switch 536*b* and to the 16× low switch 538*b*. In this example, the 16× first resistance 512*b* includes a ($24R_x$) resistor. The 16× first resistance 512*b* may be coupled to an op-amp virtual ground 554*b*. The 16× high switch 536*b* may be activated to apply the high reference voltage 518*a* to the 16× first resistance 512*b*. Alternatively, the 16× low switch 538*b* may be activated to apply the low reference voltage 518*b* to the 16× first resistance 512*b*. When activated, the 16× weighted resistance element 504*b* may contribute a current to the op-amp virtual ground 554*b* that is approximately 16 times that of a 1× weighted resistance element.

Figure 6:
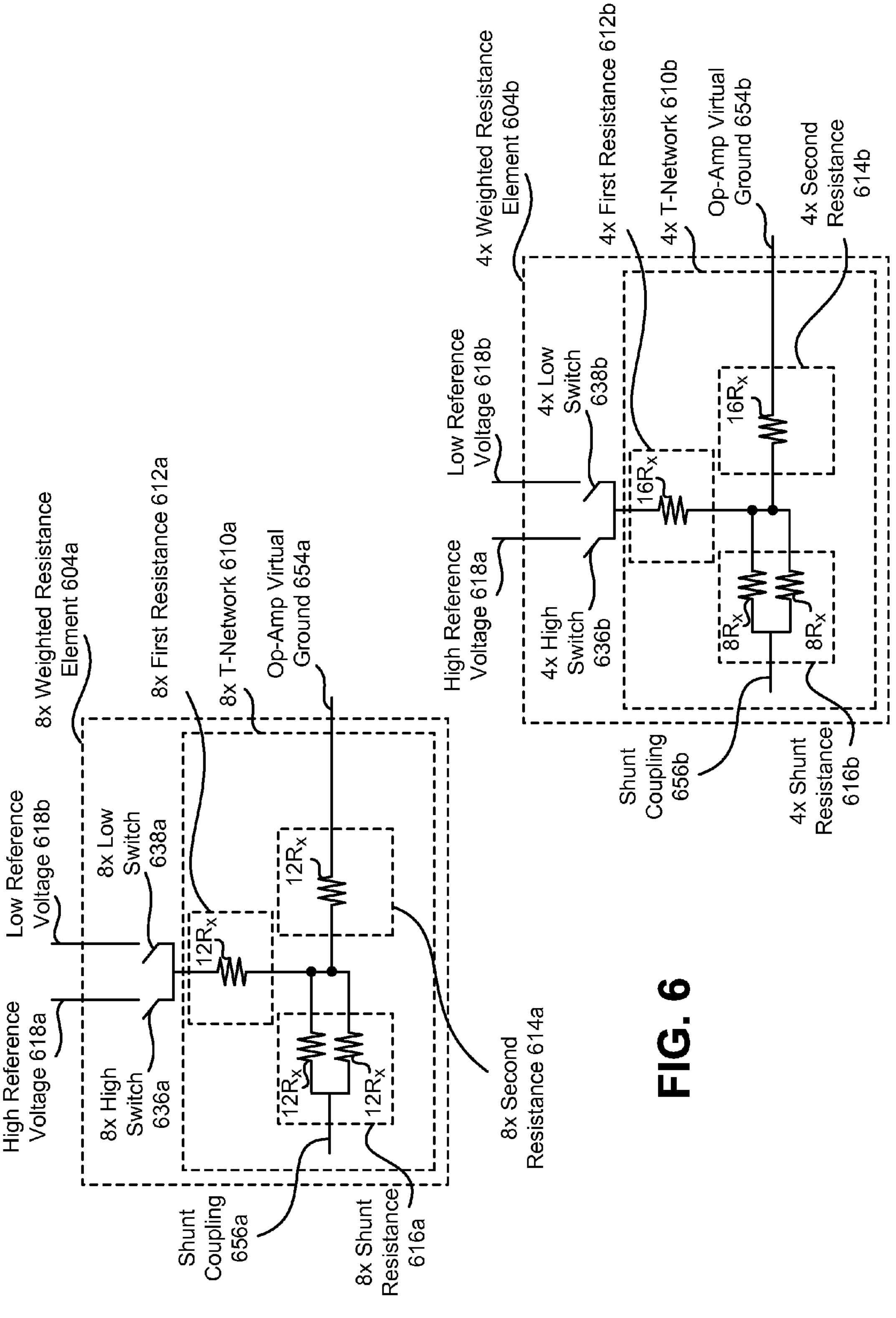
FIG. 6 is a diagram illustrating one example of an 8× weighted resistance element and one example of a 4× weighted resistance element.

FIG. 6 is a diagram illustrating one example of an 8× weighted resistance element 604*a* and one example of a 4× weighted resistance element 604*b*. In accordance with the systems and methods disclosed herein, digital-to-analog converter circuitry includes multiple weighted resistance elements.

The 8× weighted resistance element 604*a* illustrated in FIG. 6 includes an 8× high switch 636*a* coupled to a high reference voltage 618*a* and an 8× low switch 638*a* coupled to a low reference voltage 618*b*. The 8× weighted resistance element 604*a* also includes an 8× T-network 610*a*. The 8× T-network 610*a* includes an 8× first resistance 612*a*, an 8× shunt resistance 616*a* and an 8× second resistance 614*a*. The 8× first resistance 612*a* is coupled to the 8× high switch 636*a* and to the 8× low switch 638*a*. In this example, the 8× first resistance 612*a* includes a ($12R_x$) resistor. The 8× first resistance 612*a* is coupled to the 8× shunt resistance 616*a* and to the 8× second resistance 614*a*. In this example, the 8× shunt resistance 616*a* includes two ($12R_x$) resistors in parallel. A shunt coupling 656*a* couples the 8× shunt resistance 616*a* to ground or to an inverse differential signal path (e.g., the shunt resistance 616*a* may be coupled to the inverse signal path in a differential configuration or to ground in a single-ended configuration). In this example, the 8× second resistance 614*a* includes a ($12R_x$) resistor. The 8× second resistance 614*a* may be coupled to an op-amp virtual ground 654*a*. The 8× high switch 636*a* may be activated to apply the high reference voltage 618*a* to the 8× T-network 610*a*. Alternatively, the 8× low switch 638*a* may be activated to apply the low reference voltage 618*b* to the 8× T-network 610*a*. When activated, the 8× weighted resistance element 604*a* may contribute a current to the op-amp virtual ground 654*a* that is approximately eight times that of a 1× weighted resistance element.

The 4× weighted resistance element 604*b* illustrated in FIG. 6 includes a 4× high switch 636*b* coupled to a high reference voltage 618*a* and a 4× low switch 638*b* coupled to a low reference voltage 618*b*. The 4× weighted resistance element 604*b* also includes a 4× T-network 610*b*. The 4× T-network 610*b* includes a 4× first resistance 612*b*, a 4× shunt resistance 616*b* and a 4× second resistance 614*b*. The 4× first resistance 612*b* is coupled to the 4× high switch 636*b* and to the 4× low switch 638*b*. In this example, the 4× first resistance 612*b* includes a ($16R_x$) resistor. The 4× first resistance 612*b* is coupled to the 4× shunt resistance 616*b* and to the 4× second resistance 614*b*. In this example, the 4× shunt resistance 616*b* includes two ($8R_x$) resistors in parallel. A shunt coupling 656*b* couples the 4× shunt resistance 616*b* to ground or to an inverse differential signal path (e.g., the shunt resistance 616*b* may be coupled to the inverse signal path in a differential configuration or to ground in a single-ended configuration). In this example, the 4× second resistance 614*b* includes a ($16R_x$) resistor. The 4× second resistance 614*b* may be coupled to an op-amp virtual ground 654*b*. The 4× high switch 636*b* may be activated to apply the high reference voltage 618*a* to the 4× T-network 610*b*. Alternatively, the 4× low switch 638*b* may be activated to apply the low reference voltage 618*b* to the 4× T-network 610*b*. When activated, the 4× weighted resistance element 604*b* may contribute a current to the op-amp virtual ground 654*b* that is approximately four times that of a 1× weighted resistance element.

Figure 7:
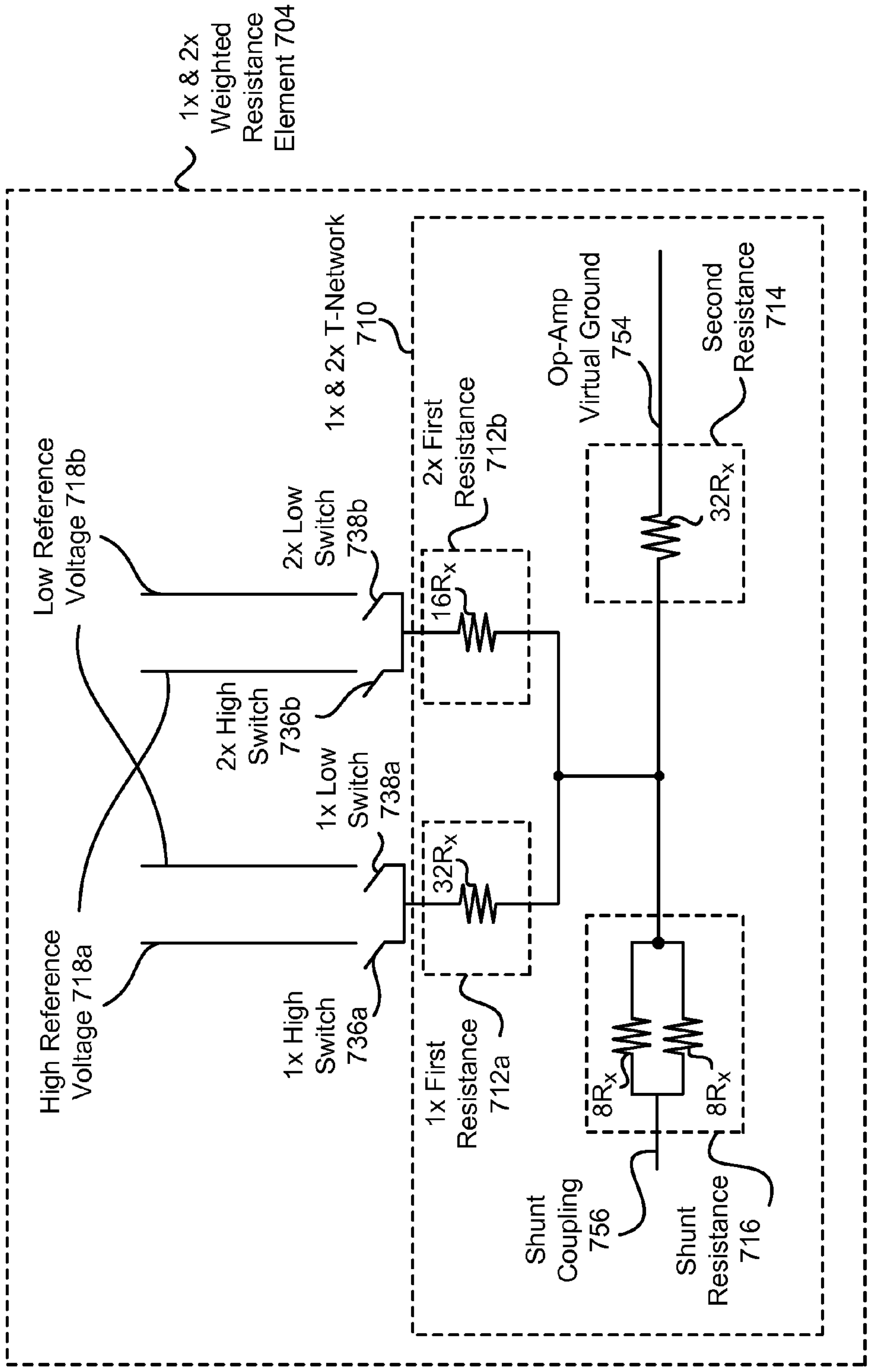
FIG. 7 is a diagram illustrating one example of a 1×& 2× weighted resistance element.

FIG. 7 is a diagram illustrating one example of a 1× & 2× weighted resistance element 704. In accordance with the systems and methods disclosed herein, digital-to-analog converter circuitry includes multiple weighted resistance elements. It should be noted that the 1× & 2× weighted resistance element 704 includes a 1× weighted resistance element and a 2× weighted resistance element. The 1× weighted resistance element may include a 1× high switch 736*a*, a 1× low switch 738*a*, a 1× first resistance 712*a*, a shunt resistance 716 (e.g., a 1× shunt resistance and/or 2× shunt resistance) and a second resistance 714 (e.g., a 1× second resistance and/or 2× second resistance). The 2× weighted resistance element may include a 2× high switch 736*b*, a 2× low switch 738*b*, a 2× first resistance 712*b*, the shunt resistance 716 (e.g., a 1× shunt resistance and/or 2× shunt resistance) and the second resistance 714 (e.g., a 1× second resistance and/or 2× second resistance). Thus, the 1× weighted resistance element and the 2× weighted resistance element may overlap. However, it should be noted that in some configurations, the 1× weighted resistance element and the 2× weighted resistance element may be implemented separately.

The 1× & 2× weighted resistance element 704 illustrated in FIG. 7 includes an 1× high switch 736*a* and a 2× high switch 736*b* coupled to a high reference voltage 718*a*. Additionally, the 1× & 2× weighted resistance element 704 includes a 1× low switch 738*a* and a 2× low switch 738*b* coupled to a low reference voltage 718*b*. The 1× & 2× weighted resistance element 704 also includes a 1× & 2× T-network 710. The 1× T-network 710 includes a 1× first resistance 712*a*, a 2× first resistance 712*b*, a shunt resistance 716 and a second resistance 714. The 1× first resistance 712*a* is coupled to the 1× high switch 736*a* and to the 1× low switch 738*a*. In this example, the 1× first resistance 712*a* includes a ($32R_x$) resistor. The 1× first resistance 712*a* is coupled to the shunt resistance 716 and to the second resistance 714. The 2× first resistance 712*b* is coupled to the 2× high switch 736*b* and to the 2× low switch 738*b*. In this example, the 2× first resistance 712*b* includes a ($16R_x$) resistor. The 2× first resistance 712*b* is coupled to the shunt resistance 716 and to the second resistance 714. In this example, the shunt resistance 716 includes two ($8R_x$) resistors in parallel. A shunt coupling 756 couples the shunt resistance 716 to ground or to an inverse differential signal path (e.g., the shunt resistance 716 may be coupled to the inverse signal path in a differential configuration or to ground in a single-ended configuration). In this example, the second resistance 714 includes a ($32R_x$) resistor. The second resistance 714 may be coupled to an op-amp virtual ground 754. The 1× high switch 736*a* may be activated to apply the high reference voltage 718*a* to the 1× (and 2×) T-network 710. Alternatively, the 1× low switch 738*a* may be activated to apply the low reference voltage 718*b* to the 1× (and 2×) T-network 710. Additionally, the 2× high switch 736*b* may be activated to apply the high reference voltage 718*a* to the (1× and) 2× T-network 710. Alternatively, the 2× low switch 738*b* may be activated to apply the low reference voltage 718*b* to the (1× and) 2× T-network 710. When activated, the 1× & 2× weighted resistance element 704 may provide 1× and/or 2× current contributions to the op-amp virtual ground 754.

Figure 8:
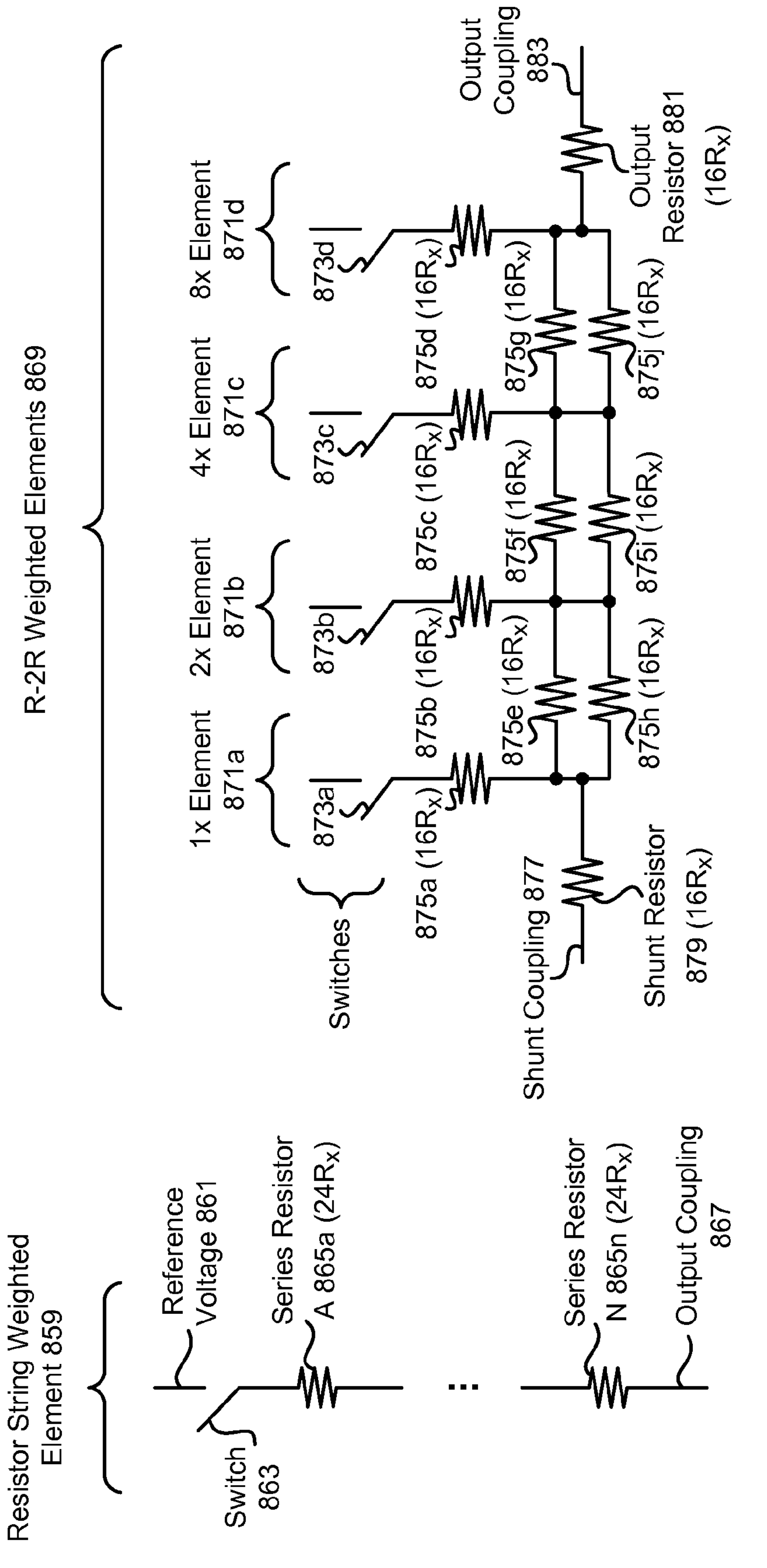
FIG. 8 is a diagram illustrating examples of known approaches for weighting elements of a digital-to-analog converter.

FIG. 8 is a diagram illustrating examples of known approaches for weighting elements of a digital-to-analog converter. In particular, FIG. 8 is given for contrast between known approaches and the approaches provided by the systems and methods disclosed herein.

In one known approach, a weighted resistive digital-to-analog converter may be implemented with resistor string weighted elements 859. In this approach, element weighting is accomplished with a series resistor string. For example, a reference voltage 861 is connected to a switch 863, which is connected to one or more resistors 865*a-n* in a series resistor string. The series resistor string is connected to an output coupling 867.

In this case, higher-weighted elements may be implemented with fewer series resistors 865 and lower-weighted elements may be implemented with more series resistors 865. For example, a 16× weighted element 859 may be implemented with a single $24R_x$ series resistor 865. Additionally, a 1× weighted element 859 may be implemented with 16 $24R_x$ series resistors 865.

One disadvantage of this approach is that differently weighted elements 859 may exhibit large response speed differences. This may be a result of parasitic capacitances corresponding to the resistor(s) 865*a-n*. For example, the parasitic capacitance corresponding to each resistor 865*a-n* may be modeled as a capacitor connected between ground and a resistor in the series resistor string. The parasitic capacitances in a resistor string weighted element 859 slow the response speed of the element. For example, as the number of series resistors 865*a-n* increases (e.g., the element 859 weight decreases), the response speed decreases for that resistor string weighted element 859. In other words, as weighted element resistance increases, the response speed of that weighted element decreases. This may lead to output glitches as described above in connection with FIG. 3. In particular, speed variations between differently weighted elements may cause noise folding to occur.

In another approach, a weighted resistive digital-to-analog-converter may be implemented with R-2R weighted elements 869 (e.g., an R-2R ladder). In the example illustrated in FIG. 8, the R-2R weighted elements 869 include a 1× element 871*a*, a 2× element 871*b*, a 4× element 871*c* and an 8× element 871*d*. The 1× element 871*a* includes a switch 873*a* and a ($16R_x$) resistor 875*a*. The 2× element 871*b* includes a switch 873*b* and a ($16R_x$) resistor 875*b*. The 4× element 871*c* includes a switch 873*c* and a ($16R_x$) resistor 875*c*. The 8× element 871*d* includes a switch 873*d* and a ($16R_x$) resistor 875*d*. The elements 871*a-d* are connected together with connecting resistors 875*e-j*. For example, two parallel resistors 875*e*, 875*h* connect the 1× element 871*a* to the 2× element 871*b*, two parallel resistors 875*f*, 875*i* connect the 2× element 871*b* to the 4× element 871*c* and two parallel resistors 875*g*, 875*j* connect the 4× element 871*c* to the 8× element 871*d*. Additionally, the 1× element 871*a* is connected to a shunt resistor 879 that provides a shunt coupling 877. Furthermore, the 8× element 871*d* is connected to an output resistor 881 that provides an output coupling 883. It should be noted that in other configurations of the R-2R approach, only a single resistor may connect elements 871 together.

In this approach, propagation delay increases with reducing bit weight. In other words, element 871 speed decreases as the element 871 weight decreases. Accordingly, differently weighted elements 871 exhibit different response speeds. In other words, the R-2R ladder exhibits different propagation delays for each input (e.g., element). For instance, this may be expressed in terms of propagation delays $T_{pd1x}$ (propagation delay for the 1× element 871*a*), $T_{pd2x}$ (propagation delay for the 2× element 871*b*), $T_{pd4x}$ (propagation delay for the 4× element 871*c*) and $T_{pd8x}$ (propagation delay for the 8× element 871*d*), where $T_{pd1x}>T_{pd2x}>T_{pd4x}>T_{pd8x}$. This may lead to output glitches as described above in connection with FIG. 3. While an R-2R approach may offer improvements over a series resistor string approach, output glitches may still be too large for some applications. As can be observed from FIG. 8, the series resistor string approach and the R-2R approach do not approximately equalize response speeds between differently weighted elements.

It should be noted that other known approaches may include digital-to-analog converters that have un-weighted (e.g., "equally weighted") elements. While these known approaches may reduce output glitches, they may require a comparatively larger implementation area than weighted digital-to-analog converters (with differently weighted elements, for example). In un-weighted digital-to-analog converters, the implementation area grows very quickly as word conversion sizes increase beyond about five bits.

In other approaches to reduce glitches, it may be possible to shape dynamic errors similar to the way that static errors are shaped using dynamic element matching. However, these techniques may be complicated and may not scale up to high bit depths. Furthermore, any limits on the switching of the weighted elements would place restrictions on the dynamic element matching and would most likely reduce its effectiveness.

Figure 9:
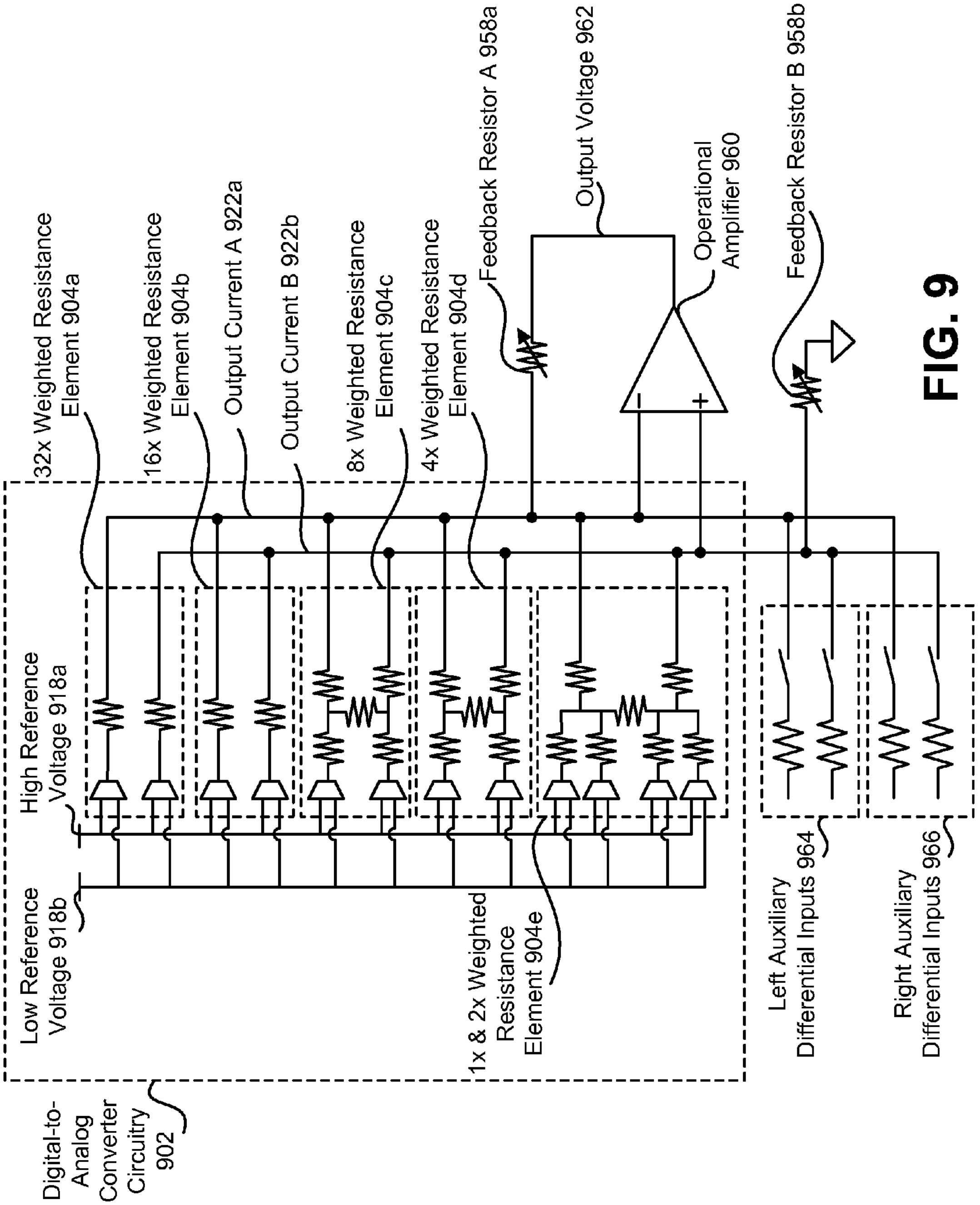
FIG. 9 is a circuit diagram illustrating one example of digital-to-analog converter circuitry in accordance with the systems and methods disclosed herein.

FIG. 9 is a circuit diagram illustrating one example of digital-to-analog converter circuitry 902 in accordance with the systems and methods disclosed herein. In particular, the digital-to-analog converter circuitry 902 includes a 32× weighted resistance element 904*a*, a 16× weighted resistance element 904*b*, an 8× weighted resistance element 904*c*, a 4× weighted resistance element 904*d* and a 1× & 2× weighted resistance element 904*e*. In this example, the 8× weighted resistance element 904*c*, the 4× weighted resistance element 904*d* and the 1× & 2× weighted resistance element 904*e* include T-networks as illustrated in FIG. 9. For instance, the 8× weighted resistance element 904*c* includes a first multiplexer coupled to a first resistor, which is coupled to a shunt resistor and to a second resistor with a first output port that may contribute to output current A 922*a* (in a first path, for example). The 8× weighted resistance element 904*c* also includes a second multiplexer coupled to a third resistor, which is coupled to the shunt resistor and to a fourth resistor with a second output port that may contribute to output current B 922*b* (in a second path, for example).

In one implementation (of a 9-bit weighted digital-to-analog converter, for example), the digital-to-analog converter circuitry 902 may include two 1× & 2× weighted resistance elements 904*e* (that provide 1× and/or 2× current contributions), two 4× weighted resistance elements 904*d* (that provide 4× current contributions), two 8× weighted resistance elements 904*c* (that provide 8× current contributions), four 16× weighted resistance elements 904*b* (that provide 16× current contributions) and sixteen 32× weighted resistance elements 904*a* (that provide 32× current contributions).

Each of the weighted resistance elements 904*a-e* are coupled to a low reference voltage 918*b* and a high reference voltage 918*a*. Furthermore, each of the weighted resistance elements 904*a-e* may provide a current contribution to output current A 922*a* and/or output current B 922*b* when activated. The weighted resistance elements 904*a-e* are coupled to an operational amplifier 960 (e.g., op-amp). Output current A 922*a* drives the negative terminal (e.g., virtual ground) of an operational amplifier 960. Output current B 922*b* drives the positive terminal of the operational amplifier 960.

The 32× weighted resistance element 904*a* may be one example of the 32× weighted resistance element 504*a* illustrated in FIG. 5. The 16× weighted resistance element 904*b* may be one example of the 16× weighted resistance element 504*b* illustrated in FIG. 5. The 8× weighted resistance element 904*c* may be one example of the 8× weighted resistance element 604*a* illustrated in FIG. 6. The 4× weighted resistance element 904*d* may be one example of the 4× weighted resistance element 604*b* illustrated in FIG. 6. The 1× & 2× weighted resistance element 904*e* may be one example of the 1× & 2× weighted resistance element 704 illustrated in FIG. 7.

As illustrated in FIG. 9, the switches included in weighted resistance elements 904 may be implemented as multiplexers. Control signals (not illustrated in FIG. 9) may control the multiplexers in order to apply the high reference voltage 918*a* and/or the low reference voltage 918*b* to none, one or more of the weighted resistance elements 904*a-e*. In some configurations, the control signals may be a weighted thermometer code corresponding to a digital signal to be converted into an analog signal. The weighted resistance elements 904*a-e* may be implemented with differential signal paths as illustrated in FIG. 9. In particular, FIG. 9 illustrates a differential digital-to-analog converter configuration. It should be noted, however, that the operational amplifier 960 output is single-ended in this example.

The digital-to-analog converter circuitry 902 may form an input resistor (e.g., variable input resistor) to the operational amplifier 960. The operational amplifier 960 provides an output voltage 962. The output voltage 962 may provide an analog signal corresponding to a digital signal that is converted by the digital-to-analog converter circuitry 902. The output voltage 962 may be coupled to (variable) feedback resistor A 958*a*, which may be coupled to the weighted resistance elements 904*a-e*. The weighted resistance elements 904*a-e* may also be coupled to (variable) feedback resistor B 958*b* (via output current B 922*b*, for example). Feedback resistor B 958*b* may be coupled to ground (e.g., digital or common ground).

In some configurations, the digital-to-analog converter circuitry 902 may be implemented as part of an audio codec. In an audio codec, each channel may have a dedicated digital-to-analog converter. Additionally or alternatively, all amplification (e.g., gain) and/or mixing may be performed in the digital domain. In some configurations, the digital-to-analog converter circuitry 902 may be based on a unit resistance $R_x$ as described above.

The digital-to-analog converter circuitry 902 may optionally be coupled to left auxiliary differential inputs 964 and right auxiliary differential inputs 966. The left and right auxiliary differential inputs 964, 966 may include resistors and switches. This may allow bypass of the digital-to-analog converter circuitry 902.

Figure 10:
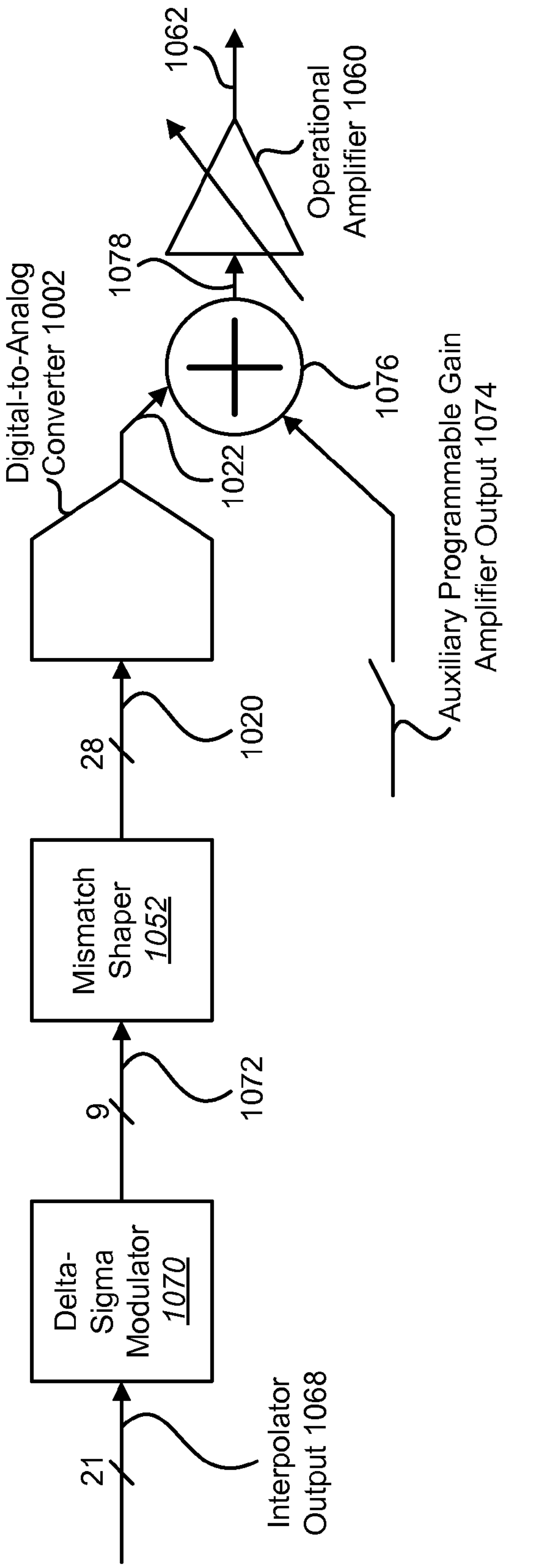
FIG. 10 is a block diagram illustrating one example of a digital-to-analog converter in a signal path.

FIG. 10 is a block diagram illustrating one example of a digital-to-analog converter 1002 in a signal path. In this example, an interpolator output 1068 is provided to a delta-sigma modulator 1070. The delta-sigma modulator 1070 provides an output 1072 to a mismatch shaper 1052. The mismatch shaper 1052 provides a control signal 1020 (e.g., weighted thermometer code) to the (resistive) digital-to-analog converter 1002. The digital-to-analog converter 1002 may be one example of one or more of the digital-to-analog converter circuitries described herein.

The digital-to-analog converter 1002 may provide an output current 1022 to a summer 1076. An auxiliary programmable gain amplifier (PGA) output 1074 may optionally be provided to the summer 1076. The summer output 1078 may be provided to a variable gain operational amplifier 1060

(e.g., power amplifier (PA)). The operational amplifier 1060 may provide an output voltage 1062.

Figure 11:
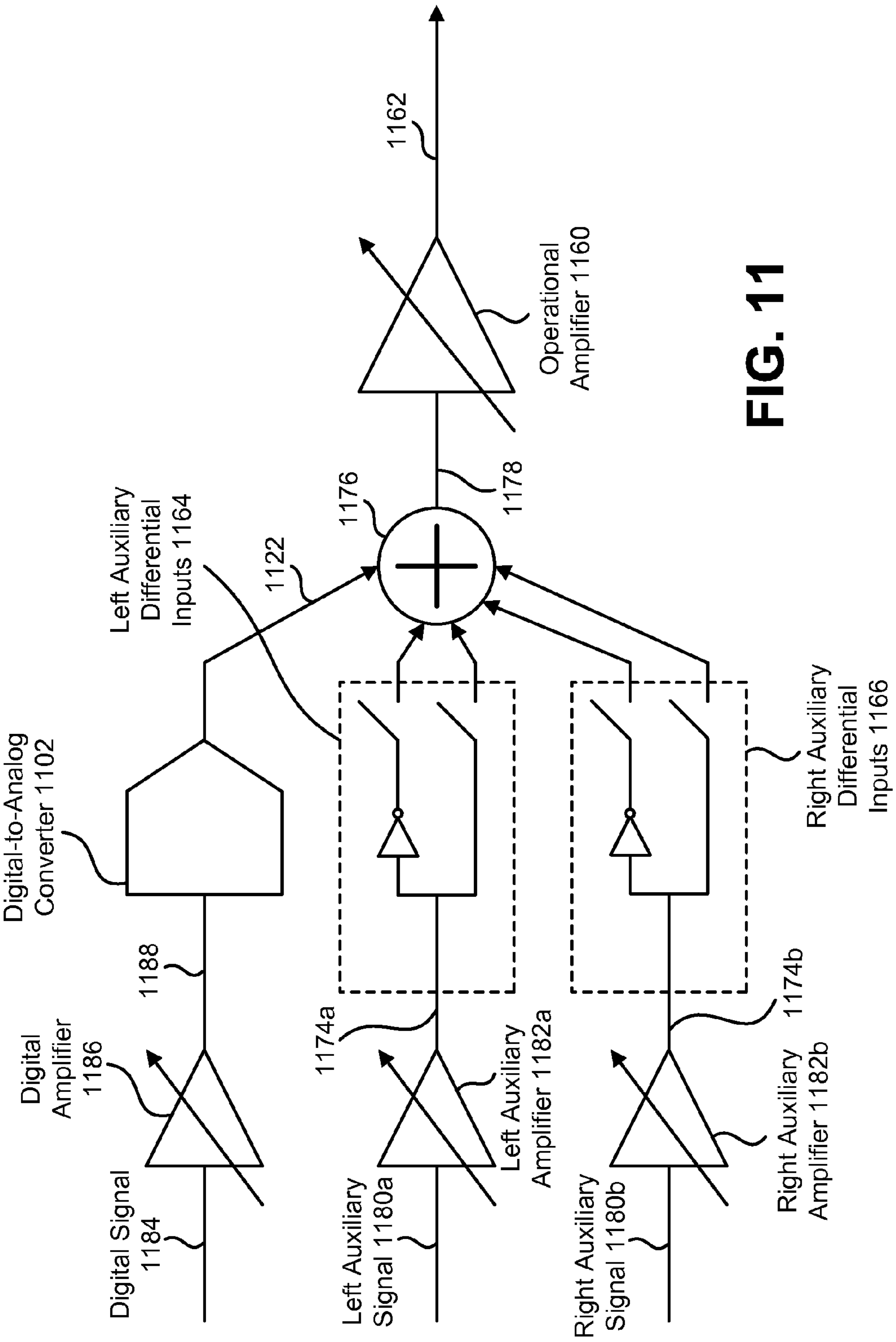
FIG. 11 is a block diagram illustrating one example of a digital-to-analog converter in receive data path of an audio codec.

FIG. 11 is a block diagram illustrating one example of a digital-to-analog converter 1102 in receive data path of an audio codec. In this example, a digital signal 1184 is provided to a (variable) digital amplifier 1186. The digital amplifier output 1188 is provided to the (resistive) digital-to-analog converter 1102. The digital-to-analog converter 1102 may be one example of one or more of the digital-to-analog converter circuitries described herein. The digital-to-analog converter 1102 may provide an output current 1122 to a summer 1176.

A left auxiliary signal 1180*a* may be optionally provided to a left auxiliary amplifier 1182*a*. The output 1174*a* of the left auxiliary amplifier 1182*a* may be split into differential signals for left auxiliary differential inputs 1164. The left auxiliary differential inputs 1164 may be optionally switched to the summer 1176. A right auxiliary signal 1180*b* may be optionally provided to a right auxiliary amplifier 1182*b*. The output 1174*b* of the right auxiliary amplifier 1182*b* may be split into differential signals for right auxiliary differential inputs 1166. The right auxiliary differential inputs 1166 may be optionally switched to the summer 1176. The summer output 1178 may be provided to a variable gain operational amplifier 1160. The operational amplifier 1160 may provide an output voltage 1162.

As mentioned above, the digital-to-analog converter 1102 may be implemented in an audio codec. The audio codec may include multiple digital-to-analog converters. Each digital-to-analog converter may be dedicated to one amplifier (e.g., PA). In some configurations, all signal amplification (e.g., gain) and signal mixing may be performed in the digital domain. The digital-to-analog converter 1102 may include one or more T-networks as described above. It may be advantageous to implement an audio codec with the digital-to-analog converter 1102 as described herein with digital gain and signal mixing.

Figure 12:
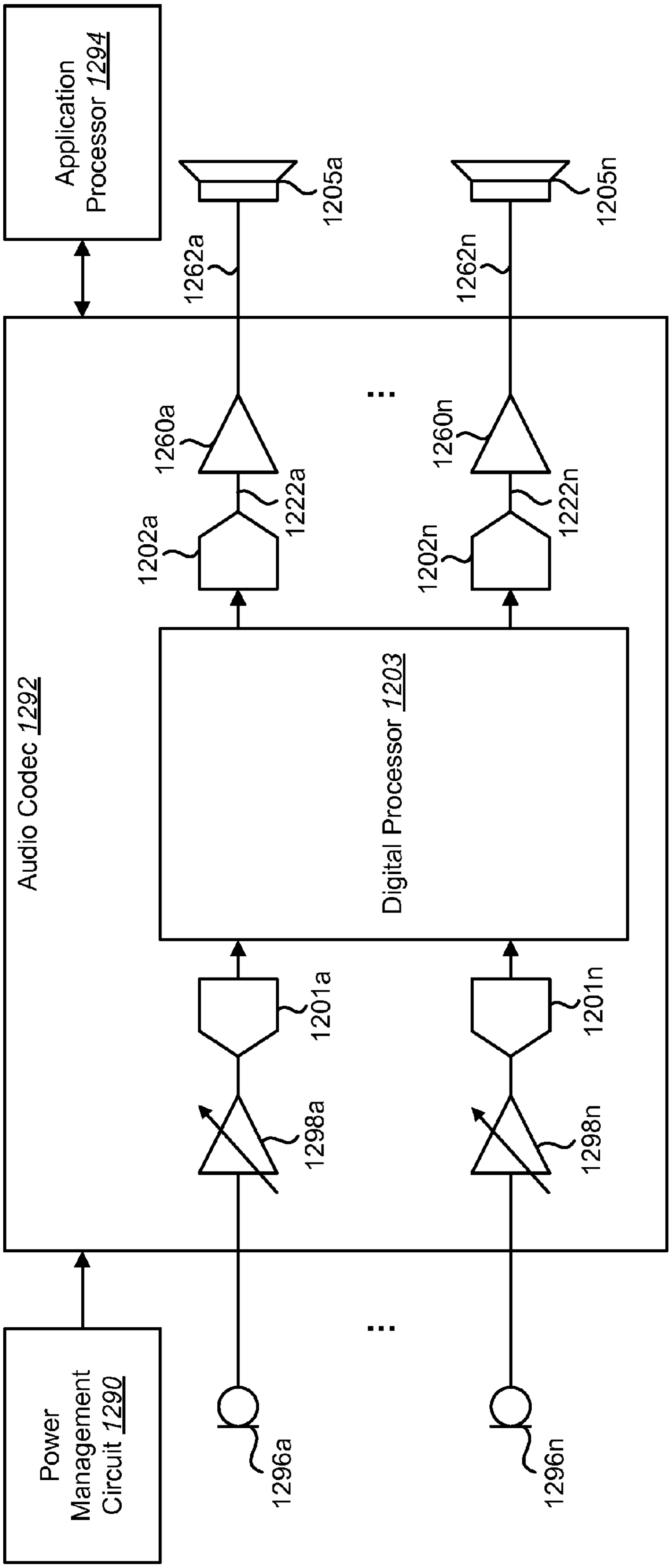
FIG. 12 is a block diagram illustrating one configuration of an audio codec in accordance with the systems and methods disclosed herein.

FIG. 12 is a block diagram illustrating one configuration of an audio codec 1292 in accordance with the systems and methods disclosed herein. The audio codec 1292 may be coupled to a power management circuit 1290, to an application processor 1294, to one or more microphones 1296*a-n* and/or one or more speakers 1205*a-n*. In some configurations, the audio codec 1292 may be implemented in an electronic device (e.g., cellular phone, smart phone, audio recorder, computing device, etc.). The audio codec 1292 may include one or more variable amplifiers 1298*a-n*, one or more analog-to-digital converters 1201*a-n*, a digital processor 1203, one or more digital-to-analog converters 1202*a-n* and one or more amplifiers 1260*a-n* (e.g., power amplifiers (PAs), operational amplifiers, etc.).

The power management circuit 1290 may provide electrical power (e.g., one or more voltages) to the audio codec 1292 to enable the audio codec 1292 to function. The application processor 1294 may provide data (e.g., digital audio signals), control signals and/or a clock signal to the audio codec 1292. The audio codec 1292 may provide data signals to the application processor 1294.

Examples of the one or more microphones 1296*a-n* include headset microphones, noise cancellation microphones, ultrasonic microphones, earpiece noise cancellation microphones, speakerphone microphones, etc. One or more of the microphones 1296*a-n* may be optionally coupled to a variable gain amplifier 1298*a-n*. The variable gain amplifier(s) 1298*a-n* may provide amplified audio signals to one or more analog-to-digital converters 1201*a-n* (ADCs), which may provide digital audio signals to a digital processor 1203. The digital processor 1203 may perform one or more functions. For example, the digital processor 1203 may perform digital amplification (gain), mixing, noise cancellation and/or filtering, etc., of signals originating from the microphones 1296*a-n* and/or the application processor 1294.

The digital processor 1203 may provide one or more digital signals to one or more digital-to-analog converters 1202*a-n*. One or more of the digital-to-analog converters 1202*a-n* may be examples of one or more of the digital-to-analog converter circuitries described herein. The digital-to-analog converter (s) 1202*a-n* may produce an output current 1222*a-n* that drives a respective amplifier 1260*a-n*. One or more amplifiers 1260*a-n* may provide an output voltage 1262*a-n* (e.g., analog signal) to one or more speakers 1205*a-n*. The one or more speakers 1205*a-n* may convert the output voltage(s) (e.g., analog signal) into acoustic signals.

Figure 13:
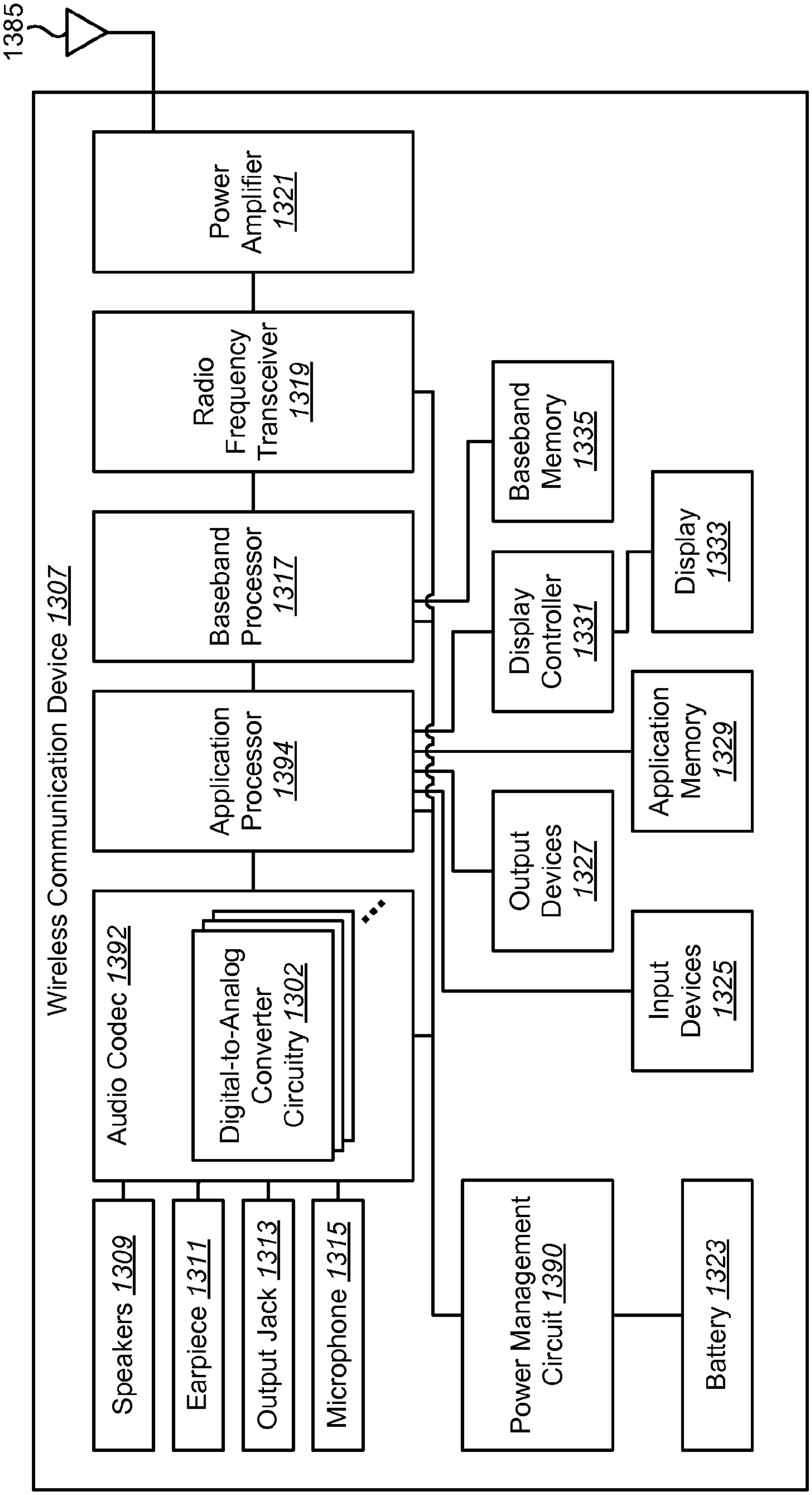
FIG. 13 is a block diagram illustrating one configuration of a wireless communication device in which digital-to-analog converter circuitry with weighted resistance elements may be implemented.

FIG. 13 is a block diagram illustrating one configuration of a wireless communication device 1307 in which digital-to-analog converter circuitry with weighted resistance elements may be implemented. The wireless communication device 1307 may include an application processor 1394. The application processor 1394 generally processes instructions (e.g., runs programs) to perform functions on the wireless communication device 1307. The application processor 1394 may be coupled to an audio coder/decoder (codec) 1392.

The audio codec 1392 may be an electronic device (e.g., integrated circuit) used for coding and/or decoding audio signals. The audio codec 1392 may be coupled to one or more speakers 1309, an earpiece 1311, an output jack 1313 and/or one or more microphones 1315. The speakers 1309 may include one or more electro-acoustic transducers that convert electrical or electronic signals into acoustic signals. For example, the speakers 1309 may be used to play music or output a speakerphone conversation, etc. The earpiece 1311 may be another speaker or electro-acoustic transducer that can be used to output acoustic signals (e.g., speech signals). The output jack 1313 may be used for coupling other devices to the wireless communication device 1307 for outputting audio, such as headphones. The speakers 1309, earpiece 1311 and/or output jack 1313 may generally be used for outputting an audio signal from the audio codec 1392. The one or more microphones 1315 may be acousto-electric transducers that convert an acoustic signal (such as a user's voice) into electrical or electronic signals that are provided to the audio codec 1392.

The audio codec 1392 may include one or more digital-to-analog converter circuitries 1302. The one or more of the digital-to-analog converter circuitries 1302 may be examples of one or more of the digital-to-analog converter circuitries 102, 402, 902 and digital-to-analog converters 1002, 1102 1202 described herein.

The application processor 1394 may also be coupled to a power management circuit 1390. One example of a power management circuit 1390 is a power management integrated circuit (PMIC), which may be used to manage the electrical power consumption of the wireless communication device 1307. The power management circuit 1390 may be coupled to a battery 1323. The battery 1323 may generally provide electrical power to the wireless communication device 1307. It should be noted that one or more of the components included within the wireless communication device 1307 that require electrical power to function may be coupled (e.g., directly and/or indirectly) to the battery 1323 and/or power management circuit 1390.

The application processor 1394 may be coupled to one or more input devices 1325 for receiving input. Examples of input devices 1325 include infrared sensors, image sensors, accelerometers, touch sensors, keypads, etc. The input devices 1325 may allow user interaction with the wireless communication device 1307. The application processor 1394 may also be coupled to one or more output devices 1327. Examples of output devices 1327 include printers, projectors, screens, haptic devices, etc. The output devices 1327 may allow the wireless communication device 1307 to produce output that may be experienced by a user.

The application processor 1394 may be coupled to application memory 1329. The application memory 1329 may be any electronic device that is capable of storing electronic information. Examples of application memory 1329 include double data rate synchronous dynamic random access memory (DDRAM), synchronous dynamic random access memory (SDRAM), flash memory, etc. The application memory 1329 may provide storage for the application processor 1394. For instance, the application memory 1329 may store data and/or instructions for the functioning of programs that are run on the application processor 1394.

The application processor 1394 may be coupled to a display controller 1331, which in turn may be coupled to a display 1333. The display controller 1331 may be a hardware block that is used to generate images on the display 1333. For example, the display controller 1331 may translate instructions and/or data from the application processor 1394 into images that can be presented on the display 1333. Examples of the display 1333 include liquid crystal display (LCD) panels, light emitting diode (LED) panels, cathode ray tube (CRT) displays, plasma displays, etc.

The application processor 1394 may be coupled to a baseband processor 1317. The baseband processor 1317 generally processes communication signals. For example, the baseband processor 1317 may demodulate and/or decode received signals. Additionally or alternatively, the baseband processor 1317 may encode and/or modulate signals in preparation for transmission.

The baseband processor 1317 may be coupled to baseband memory 1335. The baseband memory 1335 may be any electronic device capable of storing electronic information, such as SDRAM, DDRAM, flash memory, etc. The baseband processor 1317 may read information (e.g., instructions and/or data) from and/or write information to the baseband memory 1335. Additionally or alternatively, the baseband processor 1317 may use instructions and/or data stored in the baseband memory 1335 to perform communication operations.

The baseband processor 1317 may be coupled to a radio frequency (RF) transceiver 1319. The RF transceiver 1319 may be coupled to a power amplifier 1321 and one or more antennas 1385. The RF transceiver 1319 may transmit and/or receive radio frequency signals. For example, the RF transceiver 1319 may transmit an RF signal using a power amplifier 1321 and one or more antennas 1385. The RF transceiver 1319 may also receive RF signals using the one or more antennas 1385. Examples of the wireless communication device 1307 include cellular phones, smart phones, laptop computers, personal digital assistants (PDAs), audio players, wireless modems, gaming systems, etc.

Figure 14:
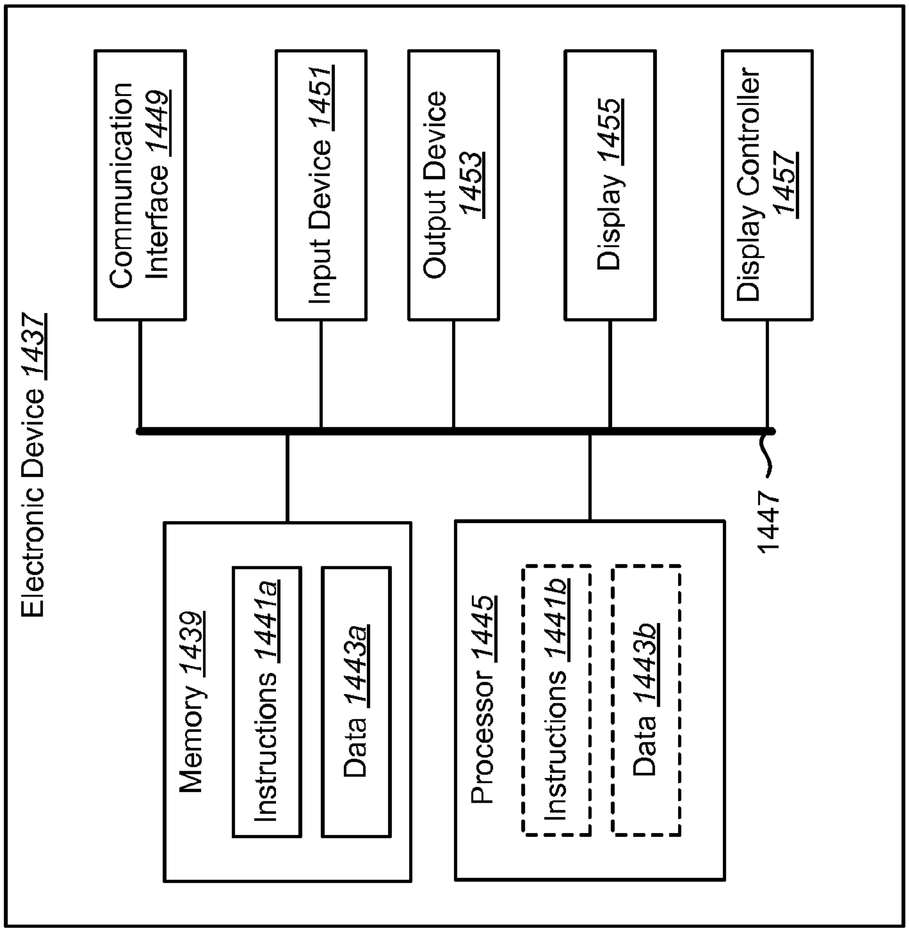
FIG. 14 illustrates various components that may be utilized in an electronic device.

FIG. 14 illustrates various components that may be utilized in an electronic device 1437. The illustrated components may be located within the same physical structure or in separate housings or structures. The electronic device 1437 may be implemented in accordance with one or more of the digital-to-analog converter circuitries 102, 402, 902 and digital-to-analog converters 1002, 1102, 1202 described above. For example, one or more of the digital-to-analog converter circuitries 102, 402, 902 and digital-to-analog converters 1002, 1102, 1202 described above may be implemented in the electronic device 1437.

The electronic device 1437 includes a processor 1445. The processor 1445 may be a general purpose single- or multi-chip microprocessor (e.g., an ARM), a special purpose microprocessor (e.g., a digital signal processor (DSP)), a microcontroller, a programmable gate array, etc. The processor 1445 may be referred to as a central processing unit (CPU). Although just a single processor 1445 is shown in the electronic device 1437 of FIG. 14, in an alternative configuration, a combination of processors (e.g., an ARM and DSP) could be used.

The electronic device 1437 also includes memory 1439 in electronic communication with the processor 1445. That is, the processor 1445 can read information from and/or write information to the memory 1439. The memory 1439 may be any electronic component capable of storing electronic information. The memory 1439 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers and so forth, including combinations thereof.

Data 1443*a* and instructions 1441*a* may be stored in the memory 1439. The instructions 1441*a* may include one or more programs, routines, sub-routines, functions, procedures, etc. The instructions 1441*a* may include a single computer-readable statement or many computer-readable statements. The instructions 1441*a* may be executable by the processor 1445 to implement the method 200 described above. Executing the instructions 1441*a* may involve the use of the data 1443*a* that is stored in the memory 1439. FIG. 14 shows some instructions 1441*b* and data 1443*b* being loaded into the processor 1445.

The electronic device 1437 may also include one or more communication interfaces 1449 for communicating with other electronic devices. The communication interfaces 1449 may be based on wired communication technology, wireless communication technology, or both. Examples of different types of communication interfaces 1449 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth. In some configurations, the electronic device 1437 may additionally include one or more antennas, transmitters and/or receivers (not shown in FIG. 14) for communicating wirelessly with other devices.

The electronic device 1437 may also include one or more input devices 1451 and one or more output devices 1453. Examples of different kinds of input devices 1451 include a keyboard, mouse, microphone, remote control device, button, joystick, trackball, touchpad, lightpen, etc. Examples of different kinds of output devices 1453 include a speaker, printer, etc. One specific type of output device 1453 which may be typically included in an electronic device 1437 is a display device 1455. Display devices 1455 used with configurations disclosed herein may utilize any suitable image projection technology, such as a cathode ray tube (CRT), liquid crystal display (LCD), light-emitting diode (LED), gas plasma, electroluminescence, or the like. A display controller 1457 may also be provided, for converting data stored in the memory 1439 into text, graphics, and/or moving images (as appropriate) shown on the display device 1455.

The various components of the electronic device 1437 may be coupled together by one or more buses, which may include a power bus, a control signal bus, a status signal bus, a data bus, etc. For simplicity, the various buses are illustrated in FIG. 14 as a bus system 1447. It should be noted that FIG. 14 illustrates only one possible configuration of an electronic device 1437. Various other architectures and components may be utilized.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. Digital-to-analog converter circuitry, comprising:

a plurality of weighted resistance elements, wherein at least one of the weighted resistance elements is not arranged in an R-2R ladder, and wherein a first weighted resistance element comprises:

a switch coupled to a reference voltage; and a T-network coupled to the switch, wherein the T-network approximately equalizes a first response speed of the first weighted resistance element with a response speed of a differently weighted resistance element.

2. The digital-to-analog converter circuitry of claim 1, wherein the T-network comprises:

a first resistance coupled to the switch;

a second resistance coupled to the first resistance; and a shunt resistance coupled to the first resistance and to the second resistance.

3. The digital-to-analog converter circuitry of claim 2, wherein the T-network further comprises:

a third resistance coupled to the shunt resistance; and a fourth resistance coupled to the third resistance and to the shunt resistance.

4. The digital-to-analog converter circuitry of claim 3, wherein the switch is a first high switch, the reference voltage is a high reference voltage, and the first weighted resistance element further comprises:

a first low switch coupled to a low reference voltage and to the first resistance;

a second high switch coupled to the high reference voltage and to the third resistance; and a second low switch coupled to the low reference voltage and to the third resistance.

5. The digital-to-analog converter circuitry of claim 1, wherein the plurality of weighted resistance elements comprises:

a 32× weighted resistance element;

a 16× weighted resistance element;

an 8× weighted resistance element;

a 4× weighted resistance element;

a 2× weighted resistance element; and a 1× weighted resistance element.

6. The digital-to-analog converter circuitry of claim 5, wherein $R_x$ is a unit resistance, and wherein the 32× weighted resistance element comprises a 32× first resistance comprising two $24R_x$ resistors in parallel and the 16× weighted resistance element includes a 16× first resistance comprising one $24R_x$ resistor.

7. The digital-to-analog converter circuitry of claim 5, wherein $R_x$ is a unit resistance, and wherein the 8× weighted resistance element comprises:

an 8× first resistance comprising one $12R_x$ resistor;

an 8× shunt resistance comprising two $12R_x$ resistors in parallel; and an 8× second resistance comprising one $12R_x$ resistor.

8. The digital-to-analog converter circuitry of claim 5, wherein $R_x$ is a unit resistance, and wherein the 4× weighted resistance element comprises:

a 4× first resistance comprising one $16R_x$ resistor;

a 4× shunt resistance comprising two $8R_x$ resistors in parallel; and a 4× second resistance comprising one $16R_x$ resistor.

9. The digital-to-analog converter circuitry of claim 5, wherein $R_x$ is a unit resistance, and wherein the 2× weighted resistance element comprises:

a 2× first resistance comprising one $16R_x$ resistor;

a 2× shunt resistance comprising two $8R_x$ resistors in parallel; and a 2× second resistance comprising one $32R_x$ resistor.

10. The digital-to-analog converter circuitry of claim 5, wherein $R_x$ is a unit resistance, and wherein the 1× weighted resistance element comprises:

a 1× first resistance comprising one $32R_x$ resistor;

a 1× shunt resistance comprising two $8R_x$ resistors in parallel; and a 1× second resistance comprising one $32R_x$ resistor.

11. The digital-to-analog converter circuitry of claim 1, wherein each of the plurality of weighted resistance elements is coupled to a mismatch shaper.

12. The digital-to-analog converter circuitry of claim 11, wherein the mismatch shaper is coupled to a delta-sigma modulator.

13. The digital-to-analog converter circuitry of claim 1, wherein all of the weighted resistance elements are not arranged in an R-2R ladder.

14. The digital-to-analog converter circuitry of claim 1, wherein the digital-to-analog converter circuitry is implemented in an audio codec.

15. The digital-to-analog converter circuitry of claim 1, wherein the digital-to-analog converter circuitry is implemented in a wireless communication device.

16. A method for converting a digital signal to an analog signal on digital-to-analog converter circuitry, comprising:

providing a reference voltage to a plurality of weighted resistance elements, wherein at least one of the weighted resistance elements is not arranged in an R-2R ladder, and wherein a first weighted resistance element comprises a switch coupled to the reference voltage and to a T-network;

applying the reference voltage to the T-network, wherein the T-network approximately equalizes a first response speed of the first weighted resistance element with a response speed of a differently weighted resistance element; and providing an output current.

17. The method of claim 16, wherein the T-network comprises:

a first resistance coupled to the switch;

a second resistance coupled to the first resistance; and a shunt resistance coupled to the first resistance and to the second resistance.

18. The method of claim 17, wherein the T-network further comprises:

a third resistance coupled to the shunt resistance; and a fourth resistance coupled to the third resistance and to the shunt resistance.

19. The method of claim 18, wherein the switch is a first high switch, the reference voltage is a high reference voltage, and the first weighted resistance element further comprises:

a first low switch coupled to a low reference voltage and to the first resistance;

a second high switch coupled to the high reference voltage and to the third resistance; and a second low switch coupled to the low reference voltage and to the third resistance.

20. The method of claim 16, wherein the plurality of weighted resistance elements comprises:

a 32× weighted resistance element;

a 16× weighted resistance element;

an 8× weighted resistance element;

a 4× weighted resistance element;

a 2× weighted resistance element; and a 1× weighted resistance element.

21. The method of claim 20, wherein $R_x$ is a unit resistance, and wherein the 32× weighted resistance element comprises a 32× first resistance comprising two $24R_x$ resistors in parallel and the 16× weighted resistance element includes a 16× first resistance comprising one $24R_x$ resistor.

22. The method of claim 20, wherein $R_x$ is a unit resistance, and wherein the 8× weighted resistance element comprises:

an 8× first resistance comprising one $12R_x$ resistor;

an 8× shunt resistance comprising two $12R_x$ resistors in parallel; and an 8× second resistance comprising one $12R_x$ resistor.

23. The method of claim 20, wherein $R_x$ is a unit resistance, and wherein the 4× weighted resistance element comprises:

a 4× first resistance comprising one $16R_x$ resistor;

a 4× shunt resistance comprising two $8R_x$ resistors in parallel; and a 4× second resistance comprising one $16R_x$ resistor.

24. The method of claim 20, wherein $R_x$ is a unit resistance, and wherein the 2× weighted resistance element comprises:

a 2× first resistance comprising one $16R_x$ resistor;

a 2× shunt resistance comprising two $8R_x$ resistors in parallel; and a 2× second resistance comprising one $32R_x$ resistor.

25. The method of claim 20, wherein $R_x$ is a unit resistance, and wherein the 1× weighted resistance element comprises:

a 1× first resistance comprising one $32R_x$ resistor;

a 1× shunt resistance comprising two $8R_x$ resistors in parallel; and a 1× second resistance comprising one $32R_x$ resistor.

26. The method of claim 16, wherein each of the plurality of weighted resistance elements is coupled to a mismatch shaper.

27. The method of claim 26, wherein the mismatch shaper is coupled to a delta-sigma modulator.

28. The method of claim 16, wherein all of the weighted resistance elements are not arranged in an R-2R ladder.

29. The method of claim 16, wherein the digital-to-analog converter circuitry is implemented in an audio codec.

30. The method of claim 16, wherein the digital-to-analog converter circuitry is implemented in a wireless communication device.

31. A computer-program product for converting a digital signal to an analog signal, comprising a non-transitory tangible computer-readable medium having instructions thereon, the instructions being executable by a processor, the instructions comprising:

code for causing a digital-to-analog converter to provide a reference voltage to a plurality of weighted resistance elements, wherein at least one of the weighted resistance elements is not arranged in an R-2R ladder, and wherein a first weighted resistance element comprises a switch coupled to the reference voltage and to a T-network;

code for causing the digital-to-analog converter to apply the reference voltage to the T-network, wherein the T-network approximately equalizes a first response speed of the first weighted resistance element with a response speed of a differently weighted resistance element; and code for causing the digital-to-analog converter to provide an output current.

32. The computer-program product of claim 31, wherein the T-network comprises:

a first resistance coupled to the switch;

a second resistance coupled to the first resistance; and a shunt resistance coupled to the first resistance and to the second resistance.

33. The computer-program product of claim 32, wherein the T-network further comprises:

a third resistance coupled to the shunt resistance; and a fourth resistance coupled to the third resistance and to the shunt resistance.

34. The computer-program product of claim 33, wherein the switch is a first high switch, the reference voltage is a high reference voltage, and the first weighted resistance element further comprises:

a first low switch coupled to a low reference voltage and to the first resistance;

a second high switch coupled to the high reference voltage and to the third resistance; and a second low switch coupled to the low reference voltage and to the third resistance.

35. The computer-program product of claim 31, wherein each of the plurality of weighted resistance elements is coupled to a mismatch shaper.

36. An apparatus for converting a digital signal to an analog signal, comprising:

means for providing a reference voltage to a plurality of weighted resistance elements, wherein at least one of the weighted resistance elements is not arranged in an R-2R ladder, and wherein a first weighted resistance element comprises means for switching coupled to the reference voltage and to a T-network;

means for applying the reference voltage to the T-network, wherein the T-network comprises means for approximately equalizing a first response speed of the first weighted resistance element with a response speed of a differently weighted resistance element; and means for providing an output current.

37. The apparatus of claim 36, wherein the means for approximately equalizing a first response speed of the first weighted resistance element with a response speed of a differently weighted resistance element comprises:

a first resistance coupled to the means for switching;

a second resistance coupled to the first resistance; and a shunt resistance coupled to the first resistance and to the second resistance.

38. The apparatus of claim 37, wherein the means for approximately equalizing a first response speed of the first weighted resistance element with a response speed of a differently weighted resistance element further comprises:

a third resistance coupled to the shunt resistance; and a fourth resistance coupled to the third resistance and to the shunt resistance.

39. The apparatus of claim 38, wherein the means for switching is a first high switch, the reference voltage is a high reference voltage, and the first weighted resistance element further comprises:

a first low switch coupled to a low reference voltage and to the first resistance;

a second high switch coupled to the high reference voltage and to the third resistance; and a second low switch coupled to the low reference voltage and to the third resistance.

40. The apparatus of claim 36, wherein each of the plurality of weighted resistance elements is coupled to a mismatch shaper.

* * * * *